(12) United States Patent
Kim et al.

(10) Patent No.: US 10,396,205 B2
(45) Date of Patent: Aug. 27, 2019

(54) INTEGRATED CIRCUIT DEVICE

(71) Applicant: SAMSUNG ELECTRONICS CO., LTD., Suwon-si, Gyeonggi-do (KR)

(72) Inventors: Mun-hyeon Kim, Hwaseong-si (KR); Sung-man Whang, Yongin-si (KR); Chang-woo Noh, Hwaseong-si (KR); Dong-won Kim, Seongnam-si (KR); Han-su Oh, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/951,385

(22) Filed: Apr. 12, 2018

(65) Prior Publication Data

US 2019/0097054 A1    Mar. 28, 2019

(30) Foreign Application Priority Data

Sep. 28, 2017  (KR) .......................... 10-2017-0126350

(51) Int. Cl.

| | |
|---|---|
| *H01L 27/12* | (2006.01) |
| *H01L 29/06* | (2006.01) |
| *H01L 29/66* | (2006.01) |
| *H01L 29/78* | (2006.01) |
| *H01L 21/8232* | (2006.01) |

(52) U.S. Cl.
CPC ...... *H01L 29/7851* (2013.01); *H01L 21/8232* (2013.01); *H01L 27/1203* (2013.01); *H01L 29/0649* (2013.01); *H01L 29/66795* (2013.01)

(58) Field of Classification Search
CPC ............ H01L 29/7851; H01L 29/0649; H01L 29/66795; H01L 27/1203; H01L 21/8232
See application file for complete search history.

(56) References Cited

U.S. PATENT DOCUMENTS

| | | | |
|---|---|---|---|
| 7,141,856 B2 | 11/2006 | Lee et al. | |
| 7,394,117 B2 | 7/2008 | Jung et al. | |
| 7,728,381 B2 | 6/2010 | Kahng et al. | |
| 8,809,947 B1 | 8/2014 | Akarvardar et al. | |
| 9,000,537 B2 | 4/2015 | Cai et al. | |
| 9,269,815 B2 | 2/2016 | Cai et al. | |
| 9,530,775 B2 | 12/2016 | Cai et al. | |
| 9,564,353 B2 | 2/2017 | Huang et al. | |
| 9,704,864 B2 * | 7/2017 | Park | H01L 27/0886 |
| 2007/0134884 A1 * | 6/2007 | Kim | H01L 21/823437 438/424 |
| 2010/0090290 A1 * | 4/2010 | Sheen | H01L 29/66795 257/401 |

(Continued)

FOREIGN PATENT DOCUMENTS

KR    10-2005-0055978 A    6/2005

*Primary Examiner* — Mark W Tornow
(74) *Attorney, Agent, or Firm* — Lee & Morse, P.C.

(57) ABSTRACT

An integrated circuit device includes a base burying insulating film covering a lower side wall of a fin-type active region on a substrate, an isolation pattern having a top surface higher than a top surface of the base burying insulating film, and a gate line covering a channel section of the fin-type active region. The gate line has an upper gate covering an upper portion of the channel section and a lower gate protruding from the upper gate toward the substrate and filling a space between a lower side wall of the channel section and an upper side wall of the isolation pattern.

20 Claims, 19 Drawing Sheets

(56) References Cited

U.S. PATENT DOCUMENTS

| | | | |
|---|---|---|---|
| 2016/0181399 A1* | 6/2016 | Jun | H01L 21/76816 438/294 |
| 2016/0247876 A1* | 8/2016 | Chung | H01L 29/0649 |
| 2016/0343709 A1* | 11/2016 | Kim | H01L 27/0886 |
| 2017/0200810 A1 | 7/2017 | Mao | |

* cited by examiner

INTEGRATED CIRCUIT DEVICE

CROSS-REFERENCE TO RELATED APPLICATION

Korean Patent Application No. 10-2017-0126350, filed on Sep. 28, 2017, in the Korean Intellectual Property Office, and entitled: "Integrated Circuit Device," is incorporated by reference herein in its entirety.

BACKGROUND

1. Field

Embodiments relate to an integrated circuit device.

2. Description of the Related Art

With the ultra large scale integration of an integrated circuit device and the decrease in a gate length of a field effect transistor (FET), attention has been directed to a device including a FinFET having a three-dimensional (3D) channel, as well as to increasing characteristics related to operating speed, power dissipation, and economic efficiency in order to increase the overall operational reliability of transistors forming an integrated circuit device.

SUMMARY

Embodiments are directed to an integrated circuit device including a fin-type active region protruding from a substrate and extending long in a first horizontal direction; a base burying insulating film including a vertical extension and a horizontal extension on the substrate, the vertical extension covering a lower side wall of the fin-type active region and having a first top surface at a first level, and the horizontal extension being integrally connected to the vertical extension and covering a top surface of the substrate; an isolation pattern covering a side wall of the vertical extension on the horizontal extension and having a second top surface at a second level, the second level being higher than the first level: and a gate line having an upper gate and a lower gate, the upper gate extending in a second horizontal direction crossing the first horizontal direction to cover an upper portion of a channel section of the fin-type active region and the second top surface of the isolation pattern, and the lower gate protruding from the upper gate toward the substrate and filling a space on the first top surface between a lower portion of the channel section and an upper side wall of the isolation pattern.

Embodiments are also directed to an integrated circuit device including a substrate having an active region; a plurality of fin-type active regions protruding from the active region and extending in a first horizontal direction in parallel with each other; a base burying insulating film including a plurality of vertical extensions and a horizontal extension, the vertical extensions each filling a space between adjacent fin-type active regions among the plurality of fin-type active regions or covering a side wall of each of the fin-type active regions, and the horizontal extension being integrally connected to an outermost vertical extension among the plurality of vertical extensions and covering a top surface of the active region; an isolation pattern separated from the fin-type active regions with the outermost vertical extension therebetween and having an upper side wall facing a channel section of an outermost fin-type active region among the fin-type active regions; and a gate line extending in a second horizontal direction crossing the first horizontal direction to cover channel sections of the respective fin-type active regions, the base burying insulating film, and the isolation pattern. The gate line may include an upper gate covering an upper portion of the channel section of the outermost fin-type active region and a first lower gate filling a space between the upper side wall of the isolation pattern and a lower portion of the channel section of the outermost fin-type active region and protruding from the upper gate toward the substrate.

Embodiments are also directed to an integrated circuit device including a device area defined by a device isolation area on a substrate; a plurality of fin-type active regions each having a base section connected to the device area and a channel section on the base section; a base burying insulating film including a plurality of vertical extensions and a horizontal extension, the vertical extensions being between the plurality of fin-type active regions and covering opposite side walls of the base section of each of the fin-type active regions, and the horizontal extension being integrally connected to an outermost vertical extension closest to the device isolation area among the plurality of vertical extensions and covering the device area; a device isolation insulating film formed in the device isolation area and having a top surface higher than a top surface of the outermost vertical extension; and an isolation pattern between the outermost vertical extension and the device isolation insulating film, the isolation pattern having a top surface higher than the top surface of the outermost vertical extension and an upper side wall defining a narrow space between the isolation pattern and a channel section of an outermost fin-type active region closest to the device isolation area among the plurality of fin-type active regions.

BRIEF DESCRIPTION OF THE DRAWINGS

Features will become apparent to those of skill in the art by describing in detail example embodiments with reference to the attached drawings in which.

DETAILED DESCRIPTION

Figure 1A:
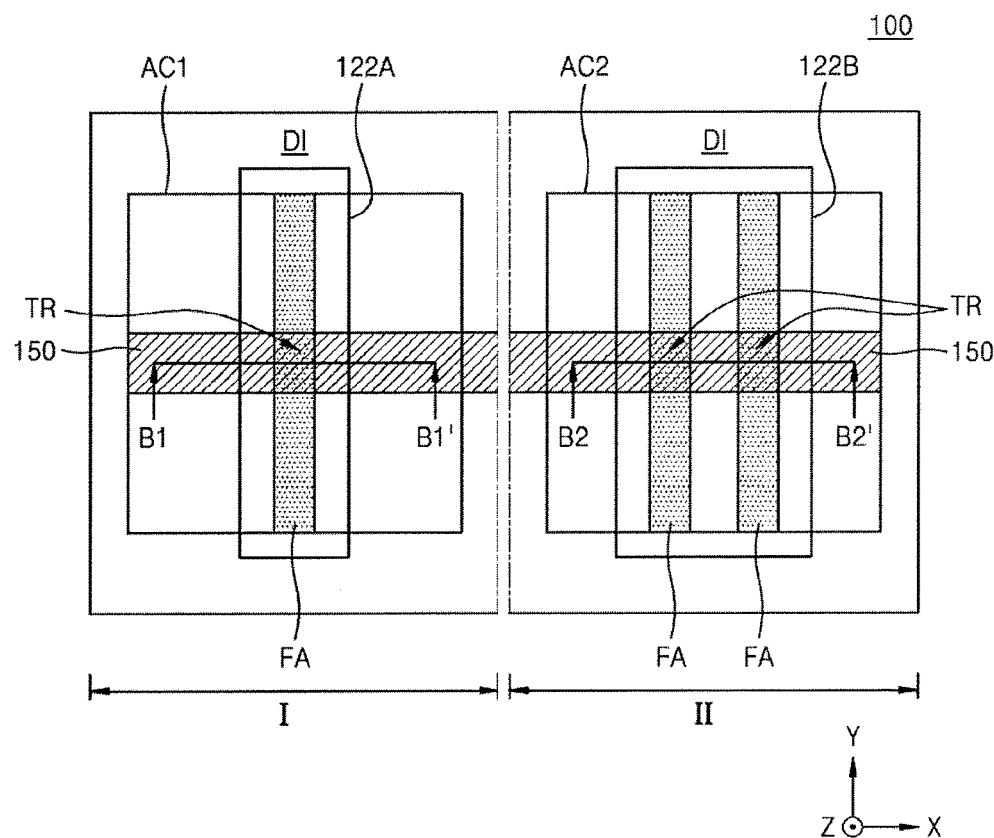
FIG. 1A illustrates a plane layout diagram showing main elements of an integrated circuit device according to an example embodiment.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

Figure 1B:
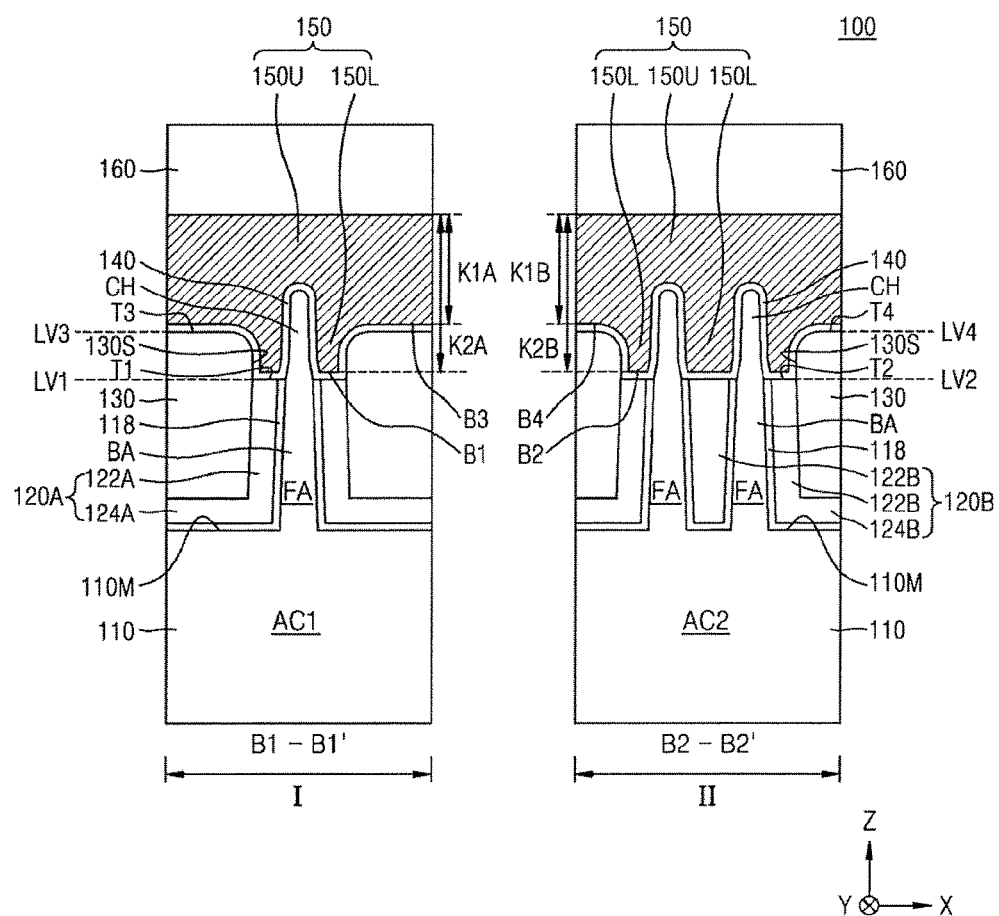
FIG. 1B illustrates a cross-sectional view of the integrated circuit device, taken along the lines B1-B1' and B2-B2' shown in FIG. 1A.

FIG. 1A illustrates a plane layout diagram showing main elements of an integrated circuit device 100 according to an example embodiment. FIG. 1B illustrates a cross-sectional view of the integrated circuit device 100, taken along the lines B1-B1' and B2-B2' shown in FIG. 1A.

The main elements of the integrated circuit device 100 including a fin field effect transistor (FinFET) will be described with reference to FIGS. 1A and 1B below.

Referring to FIGS. 1A and 1B, the integrated circuit device 100 according to the present example embodiment includes a substrate 110 having a first area I and a second area II. A transistor TR having a FinFET structure may be formed in each of the first and second areas I and II.

In some embodiments, the first and second areas I and II may perform the same or different functions. In some embodiments, elements operating in a high-power mode or low-power mode may be formed in each of the first and second areas I and II. In some embodiments, a peripheral circuit such as an input/output circuit device may be formed in each of the first and second areas I and II, or a memory device or a logic circuit may be formed in each of the first and second areas I and II.

In the present example embodiment, one fin-type active region FA protrudes from a first active region AC1 in the first area I, and two fin-type active regions FA protrude from a second active region AC2 in the second area II. A gate line 150 extends on each fin-type active region FA to cross the fin-type active region FA in each of the first and second areas I and II. A gate insulating film 140 extends between the fin-type active region FA and the gate line 150. A transistor TR may be formed at each of intersections between the fin-type active region FA and the gate line 150 on the substrate 110. Transistors TR formed in the first and second active regions AC1 and AC2 each may be an N-channel metal-oxide semiconductor (NMOS) transistor or a P-channel MOS (PMOS) transistor. Although one gate line 150 crosses one fin-type active region FA in the first area I and one gate line 150 crosses two fin-type active regions FA in the second area II in the embodiment shown in FIGS. 1A and 1B, various numbers of fin-type active regions FA and various numbers of gate lines 150 may extend to cross each other in the first and second active regions AC1 and AC2, and a transistor TR may be formed at each intersection.

In the present example embodiment, the substrate 110 has a main surface 110M extending along an X-Y plane. The substrate 110 may include, for example, a semiconductor, such as Si or Ge, or a compound semiconductor, such as SiGe, SiC, GaAs, InAs, or InP. The substrate 110 may include a conductive region such as an impurity-doped well or an impurity-doped structure. Each of the first and second active regions AC1 and AC2 of the substrate 110 may be an NMOS region having a plurality of NMOS transistors formed therein or a PMOS region having a plurality of PMOS transistors formed therein.

Although opposite side walls of each fin-type active region FA are roughly symmetrical with respect to an axis extending in a direction (i.e., a Z-direction) vertical to the main surface 110M in the embodiment illustrated in FIG. 1B, embodiments may include a plurality of fin-type active regions FA having various shapes.

The plurality of fin-type active regions FA may extend in a first horizontal direction (i.e., a Y-direction) parallel with one another. In the present example embodiment, the fin-type active regions FA include a base section BA connected to the substrate 110 and a channel section CH protruding from the base section BA away from the substrate 110.

In the present example embodiment, a base burying insulating film 120A is formed around the fin-type active region FA on the first active region AC1, and a base burying insulating film 120B is formed around the fin-type active regions FA on the second active region AC2.

The base burying insulating film 120A on the first active region AC1 may include, for example, a plurality of vertical extensions 122A, which cover opposite side walls, respectively, of the base section BA of the fin-type active region FA and extend in the Y-direction (first horizontal direction) in parallel with the fin-type active region FA. The base burying insulating film 120A may also include a plurality of horizontal extensions 124A, which horizontally extend from the vertical extensions 122A in a second horizontal direction (i.e., an X-direction) to cover the top of the first active region AC1. As shown in FIG. 1A, the vertical extensions 122A on the first active region AC1 may surround the fin-type active region FA roughly at the middle of the first active region AC1. The vertical extensions 122A may be joined to each other at lengthwise opposite ends of the fin-type active region FA. The base section BA of the fin-type active region FA on the first active region AC1 may be buried by the vertical extensions 122A.

Base sections BA of the respective fin-type active regions FA on the second active region AC2 may be buried by the base burying insulating film 120B. The base burying insulating film 120B may include a plurality of vertical extensions 122B that fill a gap between the fin-type active regions FA and cover opposite walls of the base section BA of each of the fin-type active regions FA. The base burying insulating film 120B may also include a plurality of horizontal extensions 124B integrally joined to the outermost vertical extensions 122B among the plurality of the vertical extensions 122B, the horizontal extensions 124B extending from opposite edges of the second active region AC2 in the X-direction to cover the top of the second active region AC2.

The outermost vertical extensions 122B may be vertical extensions 122B respectively closest to the X-direction opposite edges of the second active region AC2 among the plurality of the vertical extensions 122B. The plurality of the vertical extensions 122B may protrude from the substrate 110 in the vertical or third direction (i.e., the Z-direction) and may extend longitudinally in the Y-direction in parallel with the fin-type active regions FA. As shown in FIG. 1A, the plurality of the vertical extensions 122B on the second active region AC2 may surround the fin-type active regions FA roughly at the middle of the second active region AC2. The plurality of the vertical extensions 122B may be joined to one another at lengthwise opposite ends of the fin-type active regions FA. The base sections BA of the fin-type active regions FA on the second active region AC2 may be buried by the plurality of the vertical extensions 122B.

A level LV1 of a top surface T1 of each vertical extension 122A of the base burying insulating film 120A and a level LV2 of a top surface T2 of each vertical extension 122B of the base burying insulating film 120E may substantially be the same as a border level between the base section BA and the channel section CH of each fin-type active region FA. Although the top surfaces T1 and T2 of the vertical extensions 122A and 122B evenly extend horizontally in FIG. 1B, the top surfaces T1 and T2 of the vertical extensions 122A and 122B may be, for example, a convex or concave surface with respect to the substrate 110.

An insulating liner 118 may be between the fin-type active region FA and the base burying insulating film 120A in the first area I, and between the fin-type active regions FA and the base burying insulating film 120B in the second area II. The insulating liner 118 may include, for example, a silicon oxide film. The insulating liner 118 may have a thickness of, for example, about 10 Å to about 100 Å.

In the present example embodiment, an isolation pattern 130 is formed at the X-direction opposite edges of each of the first and second active regions AC1 and AC2. The isolation pattern 130 extends from opposite edges of each of the first and second active regions AC1 and AC2 in the X-direction to an isolation region DI limiting each first or second active region AC1 or AC2.

The isolation pattern 130 may be disposed on the horizontal extensions 124A and 124B of the base burying insulating films 120A and 120B in the first and second areas I and II.

In the present example embodiment, the isolation pattern 130 is separated from the fin-type active regions FA with the vertical extensions 122A and 122B therebetween in the first and second areas I and II, and the isolation pattern 130 protrudes further from the substrate 110 than the base burying insulating films 120A and 120B. Accordingly, a level LV3 of a top surface T3 of the isolation pattern 130 may be higher than the level LV1 of the top surface TI of the vertical extensions 122A in the first area I, and a level LV4 of a top surface T4 of the isolation pattern 130 may be higher than the level LV2 of the top surface T2 of the vertical extensions 122B in the second area II. The levels LV3 and LV4 of the top surfaces T3 and T4 of the isolation pattern 130 may be higher than the lowest level of the channel section CH of each fin-type active region FA and lower than the highest level thereof. In some embodiments, the levels LV3 and LV4 of the top surfaces T3 and T4 of the isolation pattern 130 may roughly correspond to the middle level of the channel section CH of the fin-type active region FA.

Among side walls of the isolation pattern 130, an upper side wall 1305 adjacent to each top surface T3 or T4 may face the channel section CH of the fin-type active region FA. A narrow space (NS in FIG. 7H) between the upper side wall 130S of the isolation pattern 130 and the channel section CH may be defined above each base burying insulating film 120A or 120B.

Among the plurality of the vertical extensions 122A and 122B of the base burying insulating films 120A and 120B, an X-direction width of outermost vertical extensions 122A and 122B closest the isolation pattern 130 may be equal to or less than an X-direction width of the fin-type active regions FA in the first and second areas I and II. As the X-direction width of outermost vertical extensions 122A and 122B becomes less, the thickness of the gate line 150 disposed on the isolation pattern 130 may decrease due to the isolation pattern 130 protruding higher from the substrate 110 than the base burying insulating films 120A and 120B. Thus, relative permittivity between the gate line 150 and other adjacent conductors may be decreased, and parasitic capacitance occurring due to coupling between adjacent conductive lines may be decreased.

The base burying insulating films 120A and 120B may include a different kind of insulating film than the isolation pattern 130. In some embodiments, a dielectric constant of the base burying insulating films 120A and 120B may be lower than a dielectric constant of the isolation pattern 130. For example, the base burying insulating films 120A and 120B may include a silicon nitride film, a SiOCN film, a SiCN film, or a combination thereof, and the isolation pattern 130 may include a silicon oxide film. In some embodiments, the isolation pattern 130 may be formed of, for example, fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), tonen silazene (TOSZ), or a combination thereof.

The gate insulating film 140 may extend longitudinally from the surface of the channel section CH of each fin-type active region FA along the inner wall of the narrow space NS (in FIG. 7H) to cover the top surfaces T1 and T2 of the base burying insulating films 120A and 120B and the upper side walls 130S and the top surfaces T3 and T4 of the isolation pattern 130. The gate insulating film 140 may include, for example, a silicon oxide film, a high-k dielectric film, or a combination thereof. The high-k dielectric film may be formed of a material having a greater dielectric constant than a silicon oxide film. The high-k dielectric film may be formed of, for example, metal oxide, or metal oxynitride. An interface layer (not shown) may be between each fin-type active region FA and the gate insulating film 140. The interface layer may include, for example, an oxide layer, a nitride layer, or an oxynitride layer.

The gate line 150 may extend to cover the top and opposite side walls of the channel section CH of each fin-type active region FA, and may cover the vertical extensions 122A and 122B of the base burying insulating films 120A and 120B, as well as the isolation pattern 130.

The gate line 150 may include, for example, an upper gate 150U, which extends long in a line shape in a second horizontal direction (i.e., an X-direction) to cover the upper side walls and top of the channel section CH of each fin-type active region FA, and a plurality of lower gates 150L, which protrude below from the upper gate 150U toward the substrate 110 and cover the lower side walls of the channel section CH of each fin-type active region FA. The upper gate 150U and the plurality of the lower gates 150L may be integrally combined in the gate line 150. Among the plurality of the lower gates 150L, some lower gates 150L may fill the narrow space NS between the upper side walls 130S of the isolation pattern 130 and each channel section CH, and face the lower side walls of the channel section CH with the gate insulating film 140 therebetween. Each lower gate 150L may have a first bottom surface B1 or B2 facing the top surface T1 or T2 of the vertical extension 122A or 122B of the base burying insulating film 120A or 120B.

The plurality of the lower gates 150L of the gate line 150 may have different widths according to positions thereof. For example, as shown in the second area II of FIG. 1B, an X-direction width of a lower gate 150L disposed between two adjacent fin-type active regions FA may be greater than an X-direction width of an outermost lower gate 150L among the lower gates 150L on the second active region AC2.

In the second area II, the lower gate 150L disposed between two adjacent fin-type active regions FA may fully cover the channel section CH of each of the two adjacent fin-type active regions FA. In the second area II. an outermost lower gate 150L among the plurality of the lower gates 150L may cover one side wall of the channel section CH of a fin-type active region FA at the outermost side of the second active region AC2 among the plurality of the fin-type active regions FA.

In the second area II, an X-direction width of an outermost vertical extension 122B among the plurality of the vertical extensions 122B may be less than an X-direction width of an inner vertical extension 122B between two adjacent fin-type active regions FA among the plurality of the vertical extensions 122B. In the second area II, the bottom of a lower gate 150L disposed between two adjacent fin-type active regions FA among the plurality of the lower gates 150L may face the top of the inner vertical extension 122B.

In the first and second areas I and II, a step difference may be formed at the bottom of the gate line 150. For example, the level of second bottom surfaces B3 and B4 of the gate line 150 respectively facing the top surfaces T3 and T4 of the isolation pattern 130 may be higher than the level of the first bottom surfaces B1 and B2 of the lower gates 150L. The top of the gate line 150 may have an even surface extending roughly parallel with the main surface 110M of the substrate 110. A thickness K1A or K1B of the gate line 150 covering the top surface T3 or T4 of the isolation pattern 130 may be less than a thickness K2A or K2B of the gate line 150 covering the top surface TI or T2 of each vertical extension 122A or 122B of the base burying insulating film 120A or 120B.

When portions of the gate line 150 on the isolation pattern 130 are thinner than portions of the gate line 150 adjacent to each fin-type active region FA, as described above, relative permittivity between the gate line 150 and other adjacent conductors (e.g., a source/drain region adjacent to the gate line 150, a source/drain contact plug placed on the source/drain region to be connected to the source/drain region, or an interconnection structure thereon) may be decreased, and parasitic capacitance occurring due to coupling between adjacent conductive lines may be decreased. Thus, degradation of the performance of a transistor may be prevented, and "ON" and "OFF" current characteristics of a FinFET may be improved, which may help increase the operating speed of the transistor and reduce power dissipation.

In some embodiments, the gate line 150 may have structure in which a metal nitride layer, a metal layer, a conductive capping layer, and a gap-fill metal film are sequentially stacked. The metal nitride layer and the metal layer may include at least one metal selected from among Ti, Ta, W, Ru, Nb, Mo, and Hf. The gap-fill metal film may include a W film or an Al film. The gate line 150 may include a work function metal layer. The work function metal layer may include at least one metal selected from among Ti, W, Ru, Nb, Mo, Hf, Ni, Co, Pt, Yb, Tb, Dy, Er, and Pd. In some embodiments, the gate line 150 may have a stack structure of, for example, TiAlC/TiN/W, a stack structure of TiN/TaN/TiAlC/TiN/W, or a stack structure of TiN/TaN/TiN/TiAlC/TiN/W.

The top of the gate line 150 may be covered with an insulating capping layer 160. The insulating capping layer 160 may include, for example, a silicon nitride film.

Figure 2:
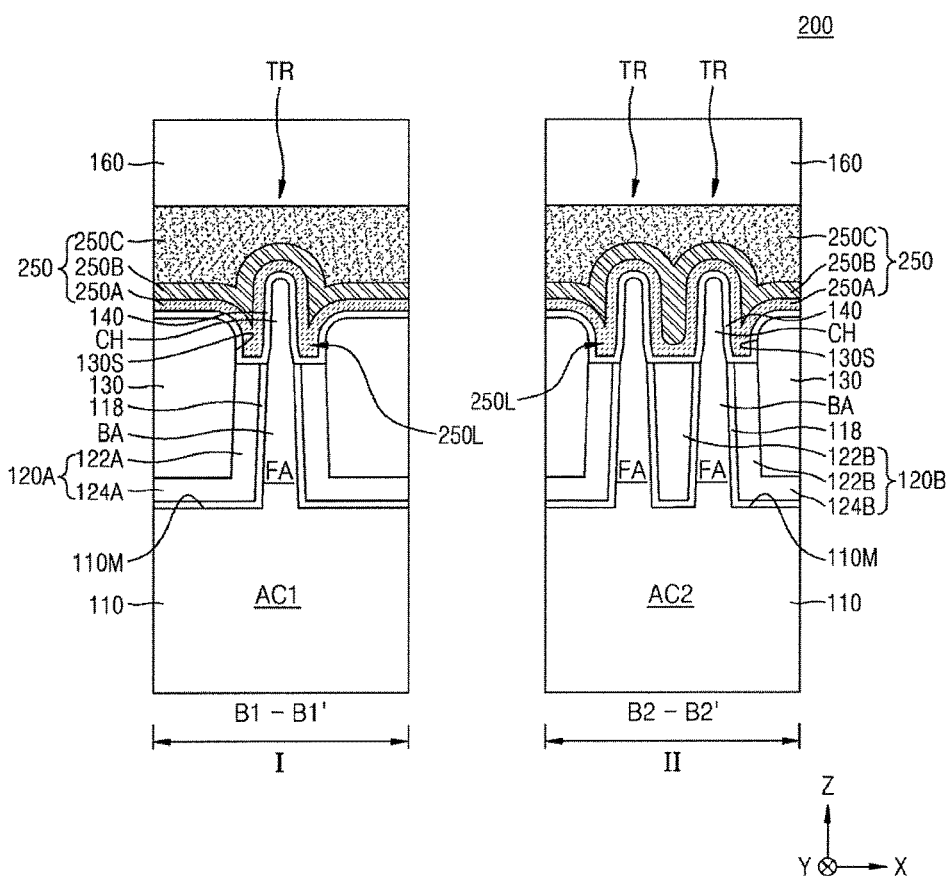
FIG. 2 illustrates a cross-sectional view of an integrated circuit device according to another example embodiment.

FIG. 2 illustrates a cross-sectional view of an integrated circuit device 200 according to another example embodiment. In FIGS. 1A through 2, like numbers or characters refer to like elements and detailed descriptions thereof may not be repeated.

Referring to FIG. 2, the integrated circuit device 200 according to the present example embodiment includes a gate line 250 extending in the X-direction to cover the channel section CH of at least one fin-type active region FA in each of the first and second areas I and II.

The structure of the gate line 250 may be similar to that of the gate line 150 described with reference to FIGS. 1A and 1B. In the present example embodiment, the gate line 250 may include a first work function metal layer 250A, a second work function metal layer 250B, and a gap-fill metal layer 250C which are sequentially stacked on the gate insulating film 140. A plurality of transistors including the gate line 250 in the first and second areas I and II may be, for example, NMOS transistors.

The first work function metal layer 250A may be formed of, for example, TiN, TaN, or a combination thereof. The second work function metal layer 250B may be formed of, for example, TiAlC, TiAlN, or a combination thereof. The gap-fill metal layer 250C may be formed of, for example, W, Al, or a combination thereof.

According to the present example embodiment, in the first and second areas I and II, the gate line 250 includes a plurality of lower gates 250L protruding below toward the substrate 110. The lower gates 250L on the base burying insulating films 120A and 120B may fill the gaps between upper side walls 130S of the isolation pattern 130 and each channel section CH, and may fill the gap between the plurality of the fin-type active regions FA. A portion of the first work function metal layer 250A filling the narrow space NS (in FIG. 7H) between each upper side wall 130S of the isolation pattern 130 and the channel section CH may cover the channel section CH with a greater thickness than other portions of the first work function metal layer 250A. Accordingly, the portion of the first work function metal layer 250A filling the narrow space NS (in FIG. 7H) between the upper side wall 130S of the isolation pattern 130 and the channel section CH may be less influenced by diffusion of Al atoms from the second work function metal layer 250B than the other portions of the first work function metal layer 250A.

A thickness of the first work function metal layer 250A at a lower gate 250L (which fills the narrow space NS (in FIG. 7H) between the upper side wall 130S of the isolation pattern 130 and the channel section CH, among the plurality of the lower gates 250L) may be greater than a thickness of the first work function metal layer 250A covering the top of the channel section CH. Thus, the lower gate 250L may have a higher effective work function than another portion of the gate line 250 covering the top of the channel section CH.

For example, a portion of the gate line 250 covering the channel section CH may have a first effective work function of about 4.1 to 4.5 eV. Since the lower gate 250L (filling the narrow space NS (in FIG. 7H) between the upper side wall 130S of the isolation pattern 130 and the channel section CH) may include the first work function metal layer 250A having a relatively greater thickness, the lower gate 250L may have a second effective work function of, for example, about 4.2 to 4.8 eV, and higher than the first effective work function. Accordingly, in one NMOS transistor at an intersection between one fin-type active region FA and the gate line 250, a region having the lower gate 250L facing the lower portion of the channel section CH may have a higher threshold voltage than another region facing the upper portion of the channel section CH. Accordingly, when the NMOS transistor operates, a threshold voltage increases at the lower portion of the channel section CH, and therefore, leakage current that may locally occur around the lower portion of the channel section CH may be suppressed. Thus, a short channel effect may be suppressed at the lower portion of the channel section CH of the fin-type active region FA, so that the performance of the transistor may be increased.

Figure 3:
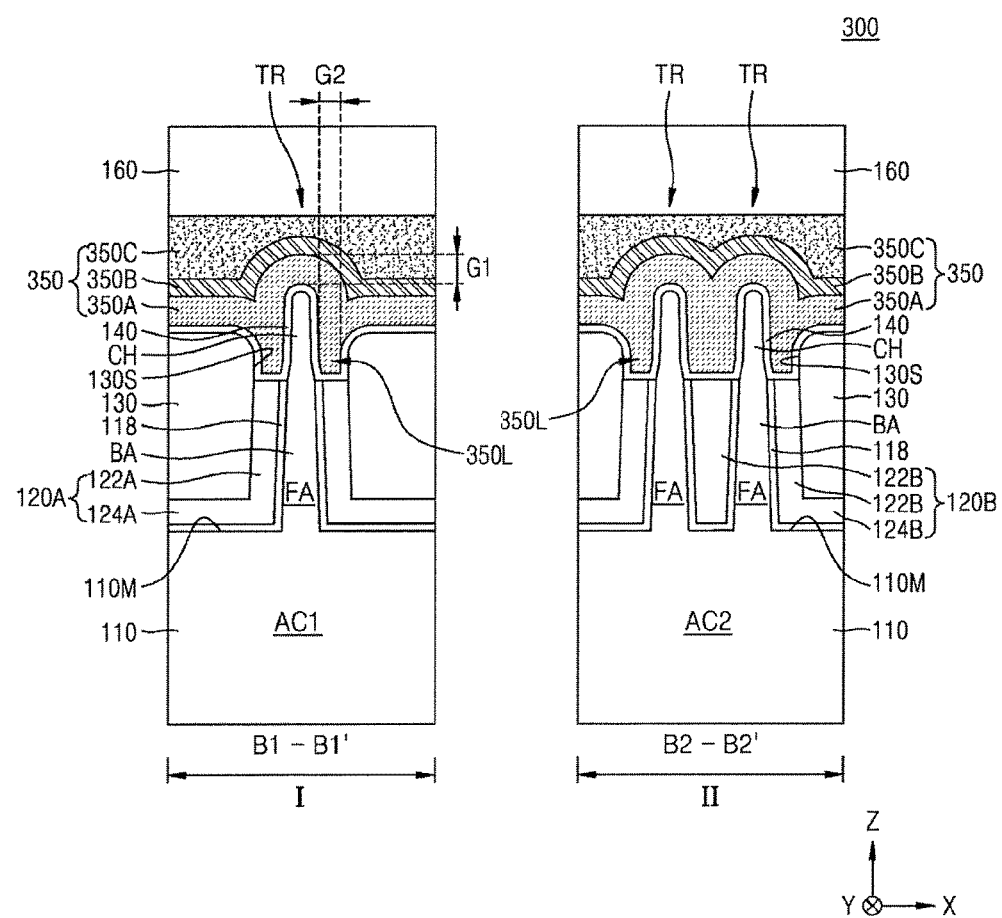
FIG. 3 illustrates a cross-sectional view of an integrated circuit device according to still another example embodiment.

FIG. 3 illustrates a cross-sectional view of an integrated circuit device 300 according to still another example embodiment. In FIGS. 1A and 1B and FIG. 3, like numbers or characters refer to like elements and detailed descriptions thereof may not be repeated.

Referring to FIG. 3, the integrated circuit device 300 according to the present example embodiment includes a gate line 350 extending in the X-direction to cover the channel section CH of at least one fin-type active region FA in each of the first and second areas I and II.

The structure of the gate line 350 may be similar to that of the gate line 150 described with reference to FIGS. 1A and 1B. The gate line 350 may include a plurality of lower gates 350L filling respective narrow spaces NS (in FIG. 7H). According to the present example embodiment, the gate line 350 may include a first work function metal layer 350A, a second work function metal layer 350B, and a gap-fill metal layer 350C which are sequentially stacked on the gate insulating film 140. A plurality of transistors including the gate line 350 in the first and second areas I and II may be PMOS transistors.

The structures of the first work function metal layer 350A, the second work function metal layer 350B, and the gap-fill metal layer 350C may be substantially the same as those of the first work function metal layer 250A, the second work function metal layer 250B, and the gap-fill metal layer 250C described above with reference to FIG. 2. However, a thickness G1 along the Z- or third direction of a portion of the first work function metal layer 350A covering the top surface and side wall of each fin-type active region FA at the upper portion of the channel section CH may be greater than a thickness G2 in the X- or second horizontal direction of a portion of the first work function metal layer 350A covering the lower side wall of the channel section CH. Accordingly, a portion of the first work function metal layer 350A filling the narrow space NS (in FIG. 7H) between each upper side wall 130S of the isolation pattern 130 and the channel section CH above each base burying insulating film 120A or 120B may be thinner than other portions of the first work function metal layer 350A, and may thus have a lower effective work function than the other portions of the first work function metal layer 350A.

For example, a portion of the gate line 350 covering the upper portion of the channel section CH may have a third effective work function of, for example, about 4.8 to 5.2 eV. Since the lower gate 350L filling the narrow space between the upper side wall 130S of the isolation pattern 130 and the channel section CH includes the first work function metal layer 350A having a relatively small thickness, the lower gate 350L may have a fourth effective work function of, for example, about 4.4 to 5.1 eV, and lower than the third effective work function. Accordingly, in one PMOS transistor at an intersection between one fin-type active region FA and the gate line 350, a region having the lower gate 350L facing the lower portion of the channel section CH may have a higher threshold voltage than another region facing the upper portion of the channel section CH. Accordingly, when the PMOS transistor operates, a threshold voltage increases at the lower portion of the channel section CH, and therefore, leakage current that may locally occur around the lower portion of the channel section CH may be suppressed. Thus, a short channel effect may be suppressed at the lower portion of the channel section CH of the fin-type active region FA, so that the performance of the transistor may be increased.

Figure 4A:
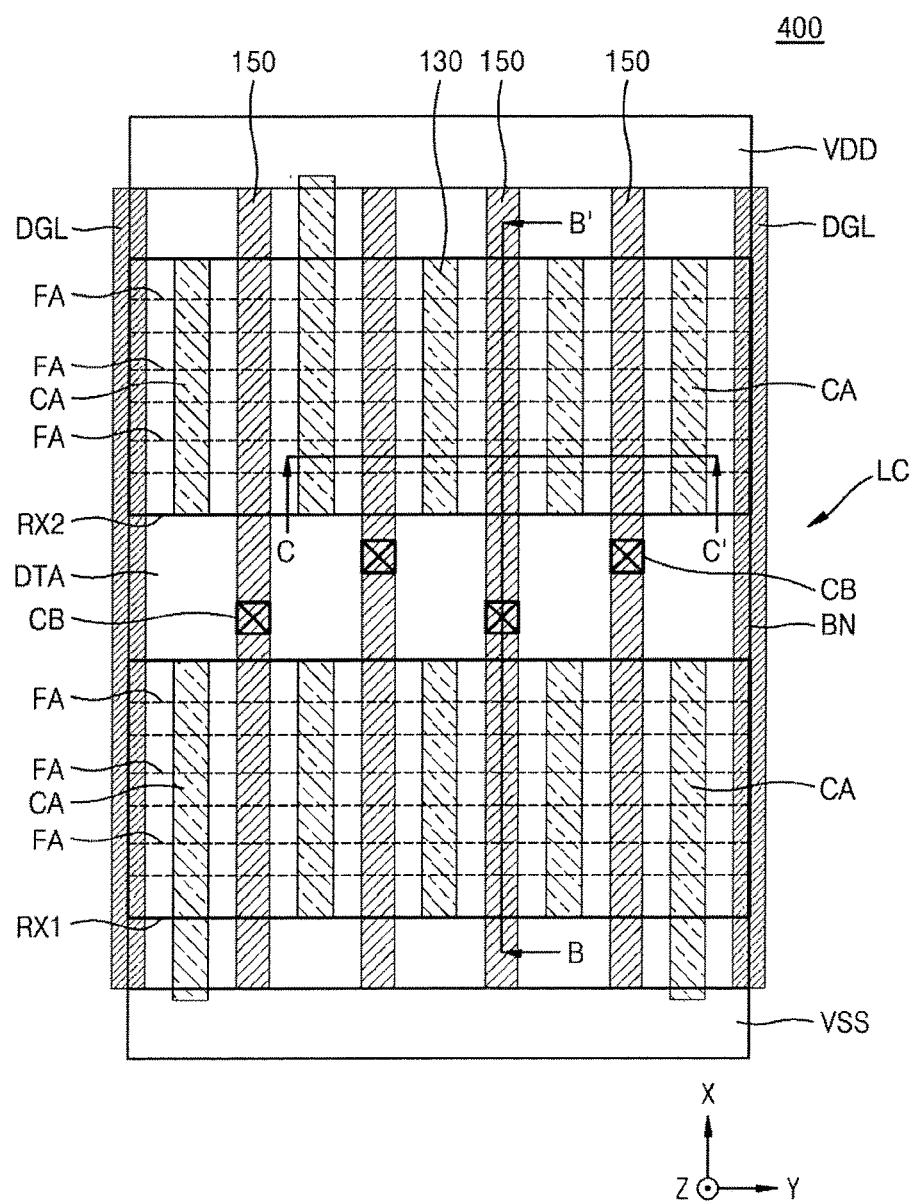
FIG. 4A illustrates a plane layout diagram showing main elements of an integrated circuit device according to another example embodiment.
Figure 4B:
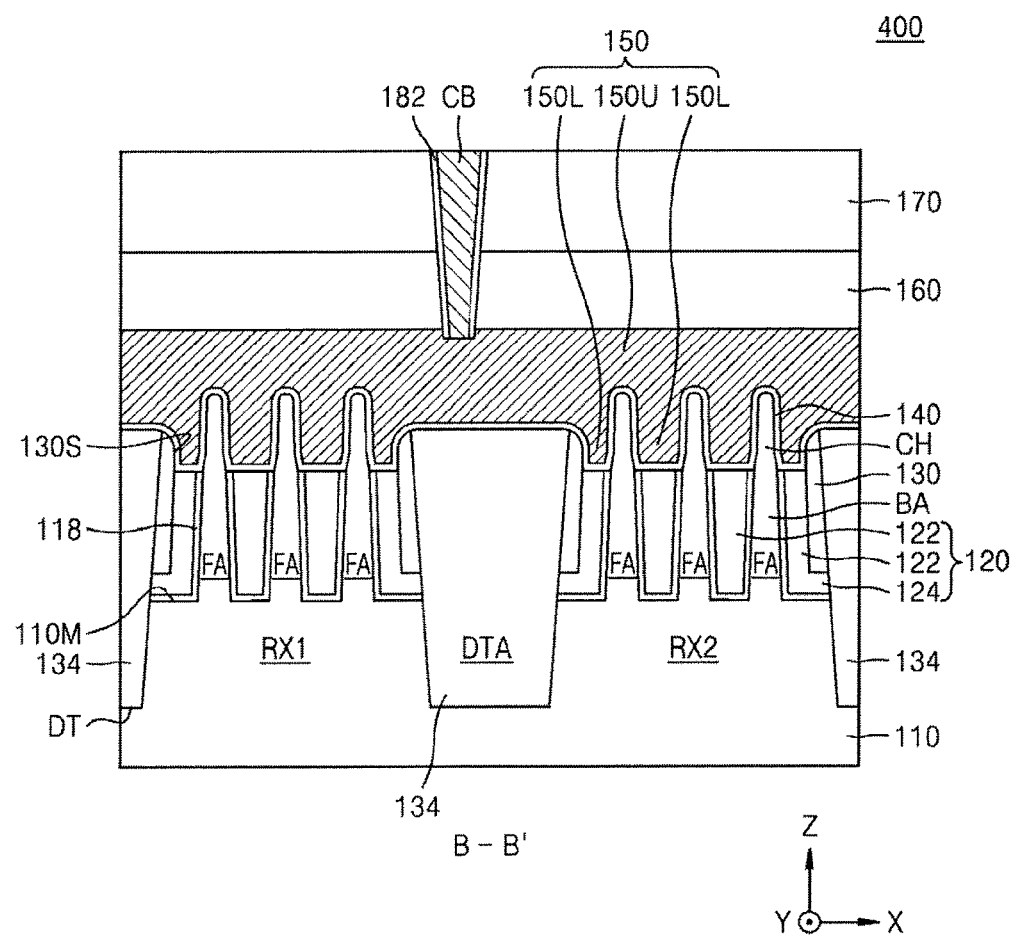
FIG. 4B illustrates a cross-sectional view of the integrated circuit device, taken along the line B-B' shown in FIG. 4A.
Figure 4C:
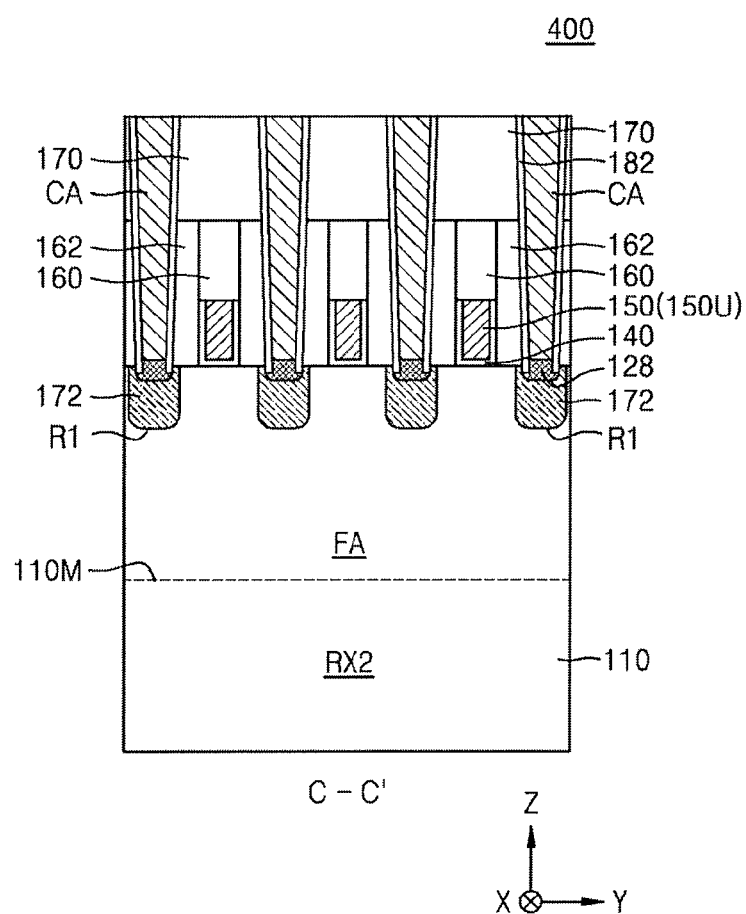
FIG. 4C illustrates a cross-sectional view of the integrated circuit device, taken along the line C-C' shown in FIG. 4A.

FIGS. 4A through 4C illustrate diagrams of an integrated circuit device according to yet another example embodiment. FIG. 4A is a plane layout diagram showing main elements of an integrated circuit device 400. FIG. 4B is a cross-sectional view of the integrated circuit device 400, taken along the line B-B' shown in FIG. 4A. FIG. 4C is a cross-sectional view of the integrated circuit device 400, taken along the line C-C' shown in FIG. 4A. In FIGS. 1A and 1B and FIGS. 4A through 4C, like numbers or characters refer to like elements and detailed descriptions thereof may not be repeated.

Referring to FIGS. 4A through 4C, the integrated circuit device 400 according to the present example embodiment includes a logic cell LC formed in a region defined by a cell boundary BN on the substrate 110.

According to the present example embodiment, the logic cell LC includes a first device area RX1 and a second device area RX2. A plurality of fin-type active regions FA protruding from the substrate 110 are formed in each of the first and second device areas RX1 and RX2. A device isolation area DTA may be disposed between the first device area RX1 and the second device area RX2.

The fin-type active regions FA may extend in a width direction of the logic cell LC (i.e., in the Y-direction) in parallel with one another. As shown in FIG. 4B, a deep trench DT may be formed in the device isolation area DTA, and the deep trench DT may be filled with a device isolation insulating film 134. The device isolation insulating film 134 may be formed of, for example, FSG, USG, BPSG, PSG, FOX, PE-TOS, TOSZ, or a combination thereof. In some embodiments, the isolation pattern 130 and the device isolation insulating film 134 may be formed of the same material.

The channel section CH of each fin-type active region FA may protrude upward from a base burying insulating film 120 in the first and second device areas RX1 and RX2. The base burying insulating film 120 may include a plurality of vertical extensions 122 and a plurality of horizontal extensions 124. The vertical extensions 122 may extend longitudinally in the Y-direction in parallel with each fin-type active region FA to cover the side walls of the base section BA of the fin-type active region FA in the first and second device areas RX1 and RX2. The horizontal extensions 124 may horizontally extend from opposite edges of each of the first and second device areas RX1 and RX2 in the X-direction to cover the top of the first or second device area RX1 and RX2. Similar to the vertical extensions 122A and 122B in FIGS. 1A and 1B, the vertical extensions 122 may be formed to surround the base section BA of each fin-type active region FA at about the middle of the first and second device areas RX1 and RX2. The detailed structure of the base burying insulating film 120 may be substantially the same as that of the base burying insulating films 120A and 120B described above with reference to FIGS. 1A and 1B.

In the present example embodiment, a plurality of gate insulating films 140 and a plurality of gate lines 150 extend on the substrate 110 in the X-direction of the logic cell LC crossing a plurality of the fin-type active regions FA. The gate insulating films 140 and the gate lines 150 may extend to cover the top surface and side walls of each fin-type active region FA, the top surface of each vertical extension 122 included in the base burying insulating film 120, the top surface of the isolation pattern 130, and the top surface of the device isolation insulating film 134. An interface layer (not shown) may be between each fin-type active region FA and the gate insulating film 140. The interface layer may include, for example, an oxide layer, a nitride layer, or an oxynitride layer.

A plurality of MOS transistors may be formed along the gate lines 150 in the first and second device areas RX1 and RX2. The MOS transistors may have a three-dimensional (3D) structure in which a channel is formed at the top surface and both side walls of each fin-type active region FA.

A dummy gate line DGL may extend along the cell boundary BN extending in the X-direction of the logic cell LC. The dummy gate line DGL may be formed of the same material as the gate lines 150 but may function as an electrical isolation region between the logic cell LC and other neighboring logic cells by maintaining an electrical floating state during the operation of the integrated circuit device 400.

A plurality of the gate lines 150 and a plurality of dummy gate lines DGL may have the same width in the Y-direction of the logic cell LC, and may be arranged with a predetermined pitch in the Y-direction. For example, a Y-direction distance between two adjacent gate lines 150 among a plurality of the gate lines 150 forming the logic cell LC may be the same as a Y-direction distance between each dummy gate line DGL and a gate line 150 closest to the dummy gate line DGL.

Top surfaces of a plurality of the gate lines 150, a plurality of the gate insulating films 140, and a plurality of the dummy gate lines DGL may be covered with the insulating capping layer 160.

A plurality of insulating spacers 162 may extend in a shape of a line in the X-direction of the logic cell LC to cover opposite walls of each line among the gate lines 150 and the dummy gate lines DGL. The insulating spacers 162 may include, for example, a silicon nitride film, a SiOCN film, a SiCN film, or a combination thereof.

An interlayer insulating film 170 may be formed above the gate lines 150 and the dummy gate lines DGL on the substrate 110 to cover the insulating capping layer 160. The interlayer insulating film 170 may include, for example, a silicon oxide film, a silicon nitride film, or a combination thereof.

A plurality of source/drain regions 172 may be formed at opposite sides of each gate line 150 on a plurality of fin-type active regions FA. The gate line 150 may be separated from each source/drain region 172 with a gate insulating film 140 and an insulating spacer 162 therebetween. A plurality of the source/drain regions 172 may be formed of, for example, a semiconductor epitaxial layer that is epitaxially grown from a plurality of recess region R1 formed in each fin-type active region FA, or a combination of semiconductor epitaxial layers. The source/drain regions 172 may include, for example, an epitaxially grown Si layer, an epitaxially grown SiC layer, or a plurality of epitaxially grown SiGe layers.

In the present example embodiment, a plurality of source/drain contact plugs CA are respectively formed on the source/drain regions 172. The source/drain regions 172 may be connected to an upper conductive line (not shown) through the respective source/drain contact plugs CA. A metal silicide film 128 may be formed between a source/drain region 172 and a source/drain contact plug CA. The metal silicide film 128 may include, for example, Ti, W, Ru, Nb, Mo, Hf, Ni, Co, Pt, Yb, Tb, Dy, Er, or Pd. For example, the metal silicide film 128 may be formed of titanium silicide.

A plurality of gate contact plugs CB may be respectively formed on a plurality of the gate lines 150. The gate lines 150 may be connected to an upper conductive line through the gate contact plugs CB.

A side wall of each plug among the source/drain contact plugs CA and the gate contact plugs CB may be covered with an insulating liner 182. The insulating liner 182 may include, for example, a silicon nitride film.

In the logic cell LC, a ground line VSS may be connected to fin-type active regions FA in the first device region RX1 through source/drain contact plugs CA, and a power supply line VDD may be connected to fin-type active regions FA in the second device region RX2 through source/drain contact plugs CA. The ground line VSS and the power supply line VDD may be formed at a level higher than the top surfaces of a plurality of the source/drain contact plugs CA and a plurality of the gate contact plugs CB. The ground line VSS and the power supply line VDD may be formed of, for example, a conductive barrier film and a wiring conductive layer. The conductive barrier film may be formed of, for example, Ti, Ta, TiN, TaN, or a combination thereof. The wiring conductive layer may be formed of, for example, Co, Cu, W, an alloy thereof, or a combination thereof.

Figure 5:
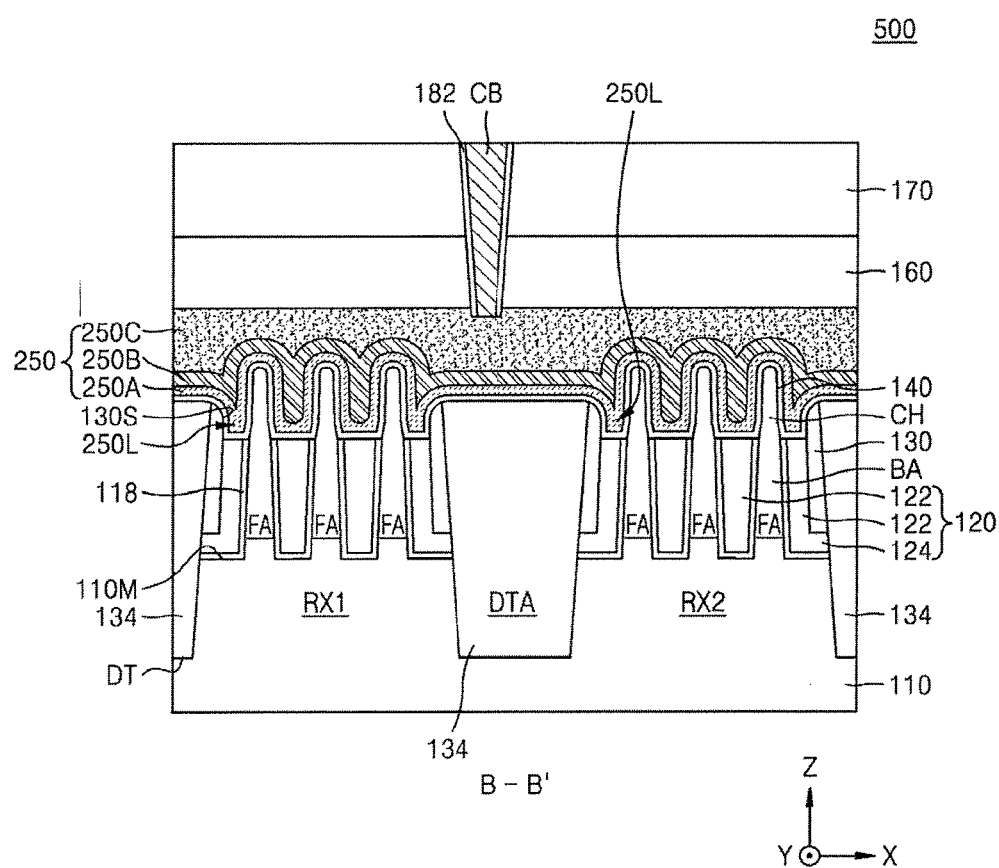
FIG. 5 illustrates a cross-sectional view of an integrated circuit device according to yet another example embodiment.

FIG. 5 illustrates a cross-sectional view of an integrated circuit device 500 according to yet another example embodiment. In FIGS. 1A through 5, like numbers or characters refer to like elements and detailed descriptions thereof may not be repeated.

Referring to FIG. 5, the integrated circuit device 500 according to the present example embodiment includes the gate line 250 extending in the X-direction to cover the channel section CH of each of a plurality of fin-type active regions FA in the first and second device areas RX1 and RX2. Similar to the gate line 250 described above with reference to FIG. 2, the gate line 250 may include the first work function metal layer 250A, the second work function metal layer 250B, and the gap-fill metal layer 250C sequentially stacked on the gate insulating film 140. A plurality of transistors including the gate line 250 in the first and second device areas RX1 and RX2 may be NMOS transistors.

Above the base burying insulating film 120 in the first and second device areas RX1 and RX2, narrow spaces between upper side walls 130S of the isolation pattern 130 and each channel section CH, and narrow spaces among the fin-type active regions FA are defined. The gate line 250 includes a plurality of lower gates 250L respectively filling the narrow spaces.

The lower gates 250L may include part of the first work function metal layer 250A. A portion of the first work function metal layer 250A filling a narrow space between each upper side wall 130S of the isolation pattern 130 and the channel section CH may be thicker than other portions of the first work function metal layer 250A. A lower gate 250L filling a narrow space between the upper side wall 130S of the isolation pattern 130 and the channel section CH among a plurality of the lower gates 250L may have a higher effective work function than other portions of the gate line 250. Accordingly, in one NMOS transistor at an intersection between one fin-type active region FA and the gate line 250, a region having the lower gate 250L facing the lower portion of the channel section CH may have a higher threshold voltage than a region including another portion of the gate line 250 facing the upper portion of the channel section CH. Accordingly, when the NMOS transistor operates, a threshold voltage increases at the lower portion of the channel section CH, and therefore, leakage current that may locally occur around the lower portion of the channel section CH may be suppressed. Thus, a short channel effect may be suppressed at the lower portion of the channel section CH of the fin-type active region FA, so that the performance of the transistor may be increased.

Figure 6:
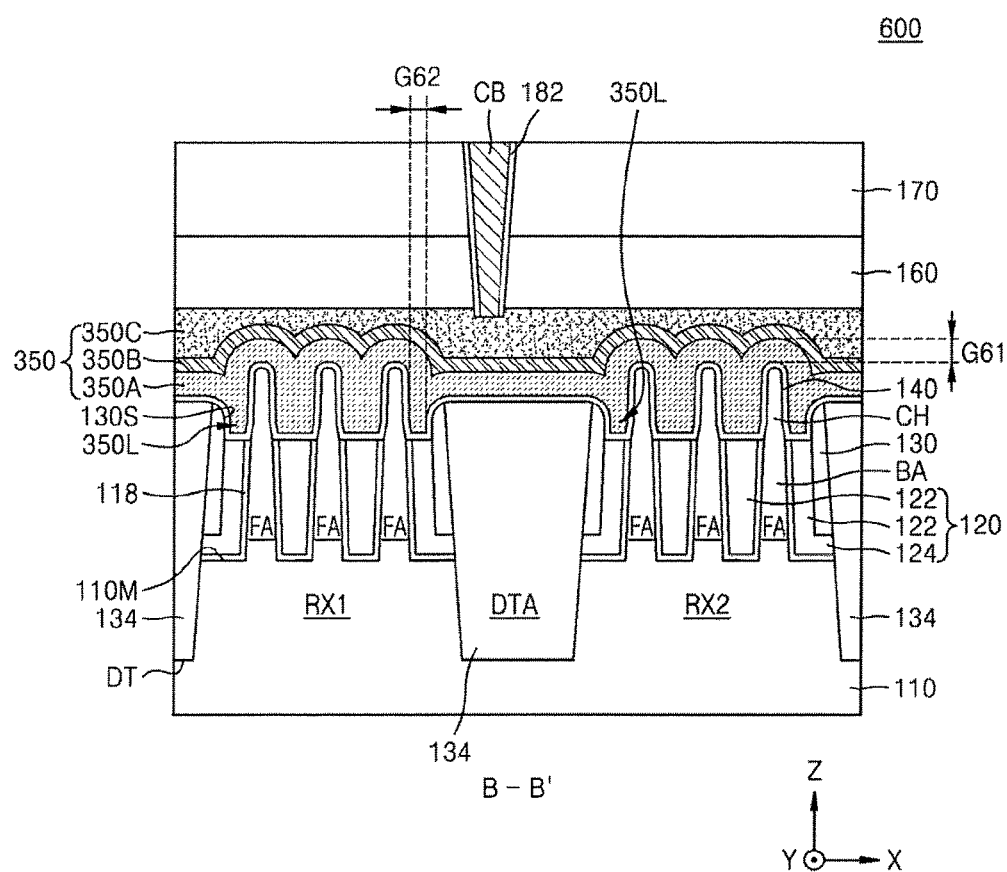
FIG. 6 illustrates a cross-sectional view of an integrated circuit device according to another example embodiment.

FIG. 6 illustrates a cross-sectional view of an integrated circuit device 600 according to another example embodiment. In FIGS. 1A through 4C and FIG. 6, like numbers or characters refer to like elements and detailed descriptions thereof may not be repeated.

Referring to FIG. 6, the integrated circuit device 600 according to the present example embodiment includes the gate line 350 extending in the X-direction to cover the channel section CH of each of a plurality of fin-type active regions FA in the first and second device areas RX1 and RX2. The gate line 350 may include the first work function metal layer 350A, the second work function metal layer 350B, and the gap-fill metal layer 350C sequentially stacked on the gate insulating film 140. The detailed structures of the first work function metal layer 350A, the second work function metal layer 350B, and the gap-fill metal layer 350C have been described above with reference to FIG. 3. A plurality of transistors including the gate line 350 may be PMOS transistors.

Similar to the descriptions made with reference to FIG. 3 above, a thickness G61 of a portion of the first work function metal layer 350A covering the top surface and side wall of each fin-type active region FA at the upper portion of the channel section CH in Z direction may be greater than a thickness G62 of a portion of the first work function metal layer 350A covering the lower side wall of the channel section CH in X direction. Accordingly, a portion of the first work function metal layer 350A filling the narrow space between each upper side wall 130S of the isolation pattern 130 and the channel section CH above the base burying insulating film 120 may be thinner than other portions of the first work function metal layer 350A, and may thus have a lower effective work function than the other portions of the first work function metal layer 350A. Accordingly, in one PMOS transistor at an intersection between one fin-type active region FA and the gate line 350, a region having the lower gate 350L facing the lower portion of the channel section CH may have a higher threshold voltage than other regions of the gate line 350. Accordingly, when the PMOS transistor operates, a threshold voltage increases at the lower portion of the channel section CH, and therefore, leakage current that may locally occur around the lower portion of the channel section CH may be suppressed. Thus, a short channel effect may be suppressed at the lower portion of the channel section CH of the fin-type active region FA, so that the performance of the transistor may be increased.

FIGS. 7A through 7J illustrate cross-sectional views of the sequential stages in a method of fabricating an integrated circuit device, according to an example embodiment. An example of a method of fabricating the integrated circuit device 100 illustrated in FIGS. 1A and 1B will be described with reference to FIGS. 7A through 7J. In FIGS. 1A and 1B and FIGS. 7A through 7J, like numbers or characters refer to like elements and detailed descriptions thereof may not be repeated.

Figure 7A:
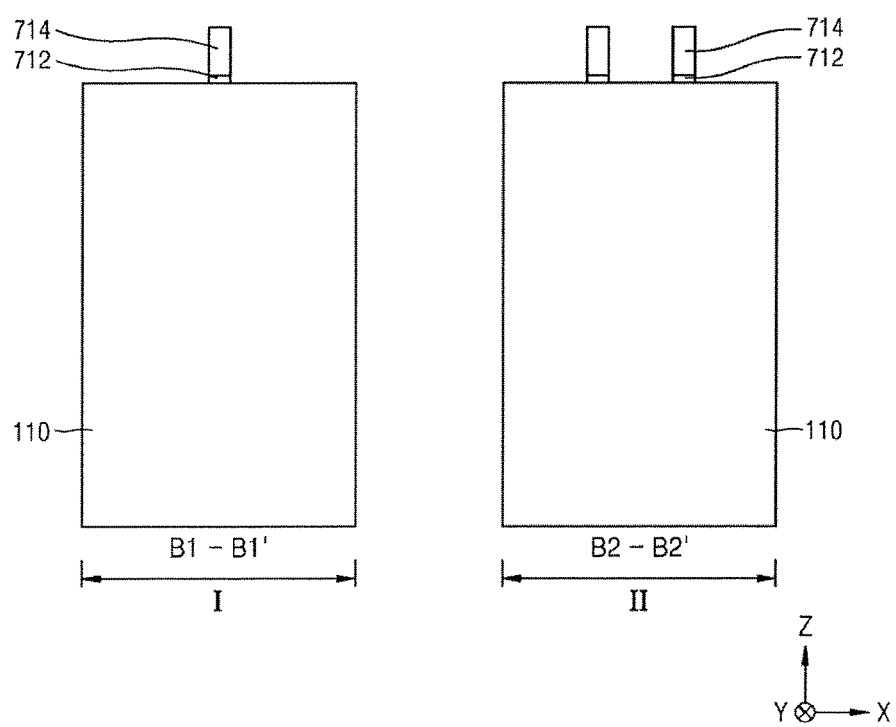
FIGS. 7A through 7J illustrate cross-sectional views of the sequential stages in a method of fabricating an integrated circuit device, according to an example embodiment.

According to the present example embodiment, referring to FIG. 7A, the substrate 110 including the first area I and the second area II is prepared. A plurality of pad oxide film patterns 712 and a plurality of mask patterns 714 are formed on the first and second areas I and II of the substrate 110.

The pad oxide film patterns 712 and the mask patterns 714 may extend in one direction (e.g., the Y-direction) in parallel with one another on the substrate 110. In some embodiments, the pad oxide film patterns 712 may be formed of an oxide film obtained by performing thermal oxidation on the surface of the substrate 110. The mask patterns 714 may include, for example, a silicon nitride film, a silicon oxynitride film, a spin on glass (SOG) film, a spin on hardmask (SOH) film, a photoresist film, or a combination thereof.

Figure 7B:
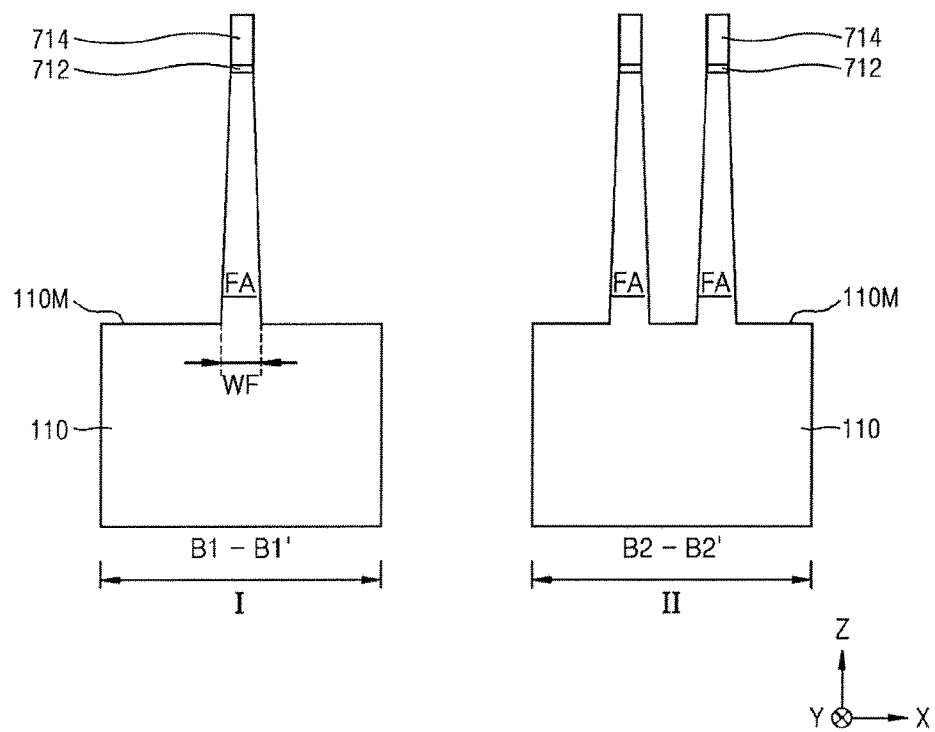

Referring to FIG. 7B, the substrate 110 is partially etched using the mask patterns 714 as etch masks to form a plurality of fin-type active regions FA protruding upward from the substrate 110 in a direction (e.g., the Z-direction) vertical to the main surface 110M of the substrate 110 and extending in the Y-direction. The fin-type active regions FA may substantially have a certain width WF in the X-direction.

Figure 7C:
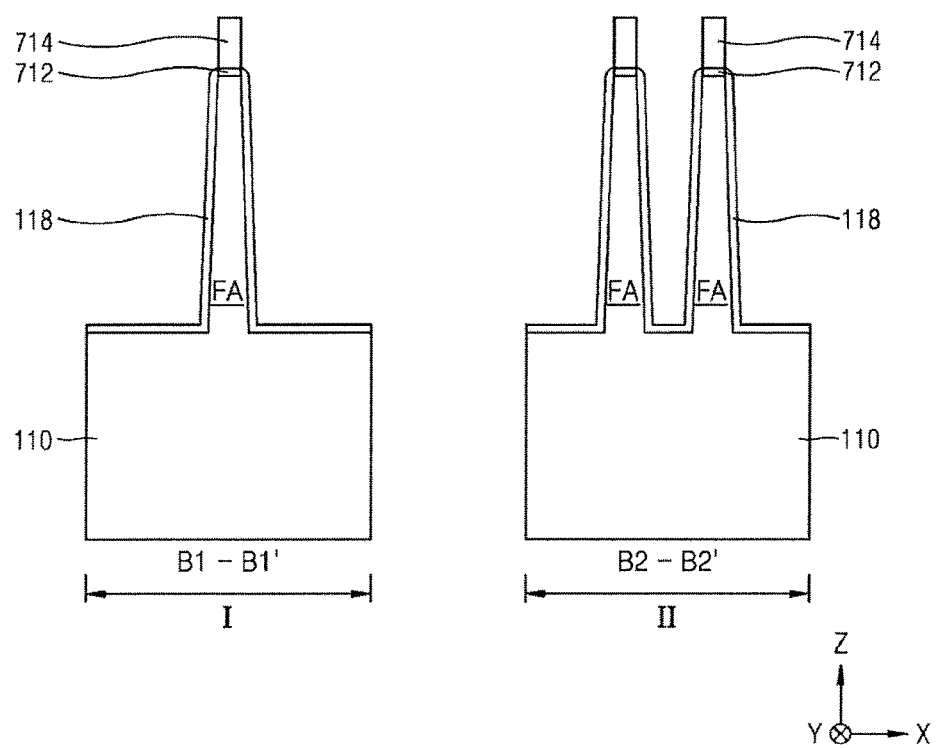

Referring to FIG. 7C, an insulating liner 118 covering the exposed surfaces of the fin-type active regions FA is formed in the first and second areas I and II.

The exposed surfaces of the fin-type active regions FA may be oxidized to form the insulating liner 118. In some embodiments, plasma oxidation may be performed to form the insulating liner 118.

Figure 7D:
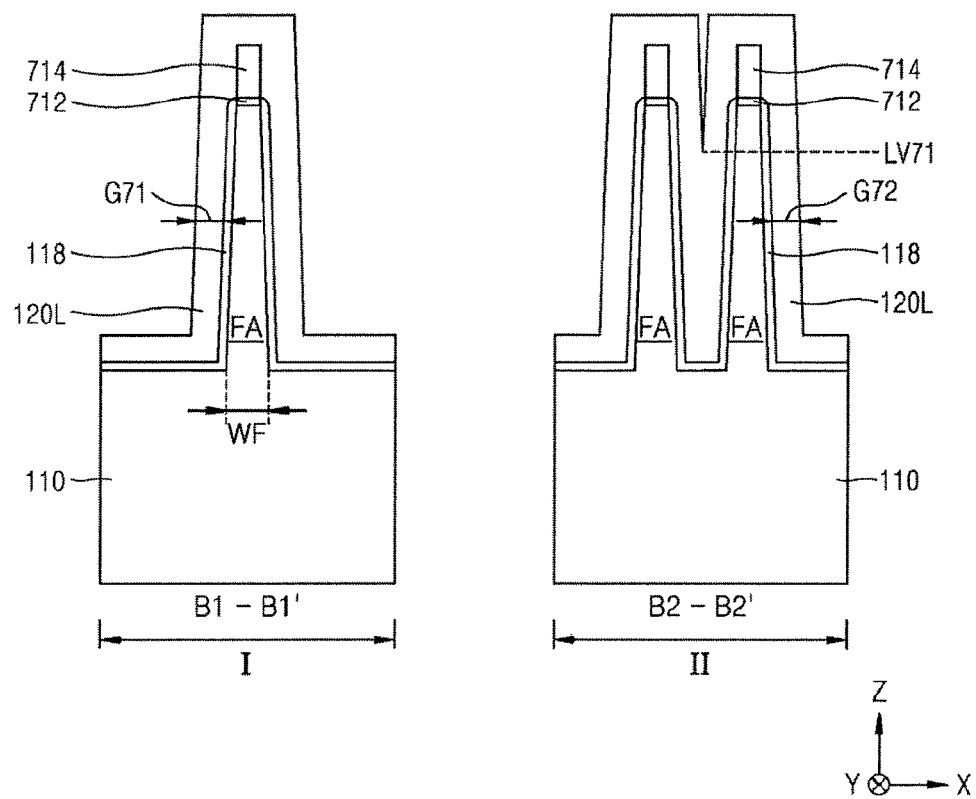

Referring to FIG. 7D, a burying insulating film 120L is formed on the entire surface of the resultant structure including the insulating liner 118 in the first and second areas I and II.

In the first area I, the burying insulating film 120L may be formed to a first thickness G71 to conformally cover opposite walls of the fin-type active region FA. The first thickness G71 may be equal to or less than the X-direction width WF of the fin-type active region FA.

In the second area II, the burying insulating film 120L may be formed to a second thickness G72 to conformally cover an outermost wall of each fin-type active region FA. The second thickness G72 may be equal to or less than the X-direction width WF of the fin-type active region FA. When the burying insulating film 120L is formed, a space between the fin-type active regions FA may be buried with the burying insulating film 120L up to a certain height from the main surface 110M of the substrate 110. In some embodiments, the space between the fin-type active regions FA in the second area II may be filled with the burying insulating film 120L up to at least a level LV71 higher than the base section BA (see FIG. 1B) of each fin-type active region FA.

The burying insulating film 120L may be formed of a material having different etching characteristics than the fin-type active regions FA and the insulating liner 118. In some embodiments, the burying insulating film 120L may include a silicon nitride film, a SiOCN film, a SiCN film, or a combination thereof. In some embodiments, the burying insulating film 120L may be formed using plasma enhanced chemical vapor deposition (PECVD), high density plasma CVD (HDP CVD), inductively coupled plasma CVD (ICP CVD), or capacitor coupled plasma CVD (CCP CVD).

Figure 7E:
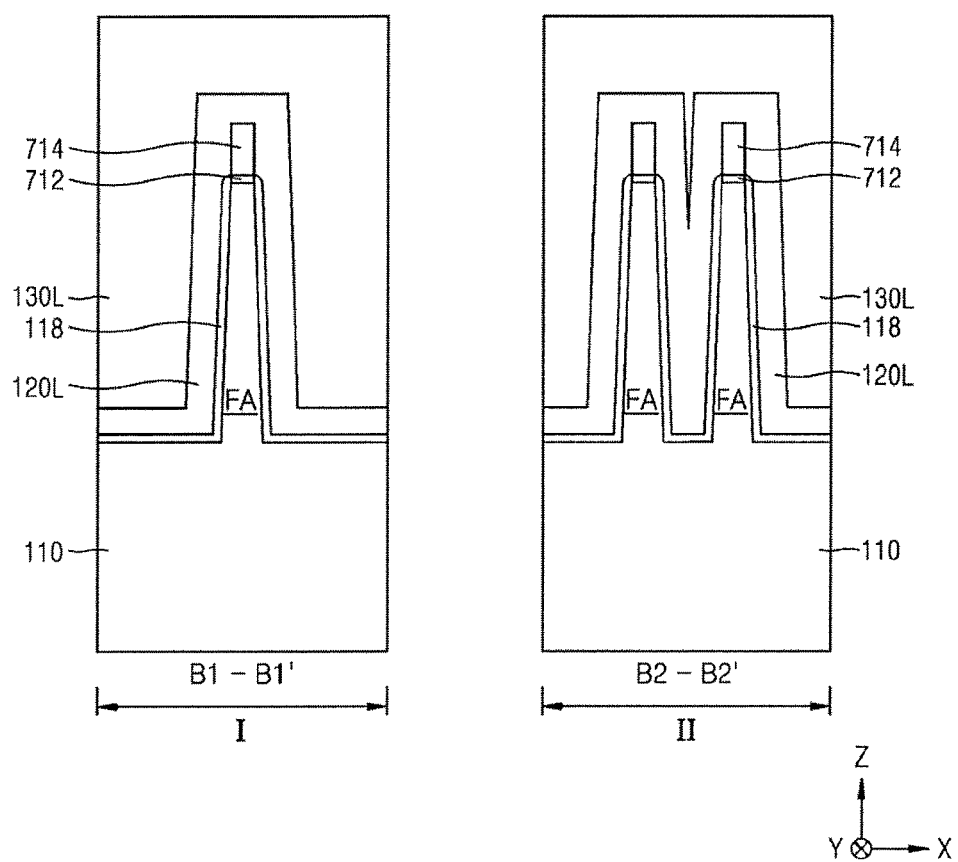

Referring to FIG. 7E, an isolation film 130L is formed to cover the resultant structure including the burying insulating film 120L.

The isolation film 130L may be formed of a material having different etching characteristics than the burying insulating film 120L. The isolation film 130L may be formed by depositing oxide on the resultant structure including the burying insulating film 120L and annealing the deposited oxide. The isolation film 130L may include a silicon oxide film. In some embodiments, the isolation film 130L may be formed of FSG, USG, BPSG, PSG, FOX, PE-TEOS, TOSZ, or a combination thereof. The isolation film 130L may be formed using flowable chemical vapor deposition (FCVD) or spin coating.

Figure 7F:
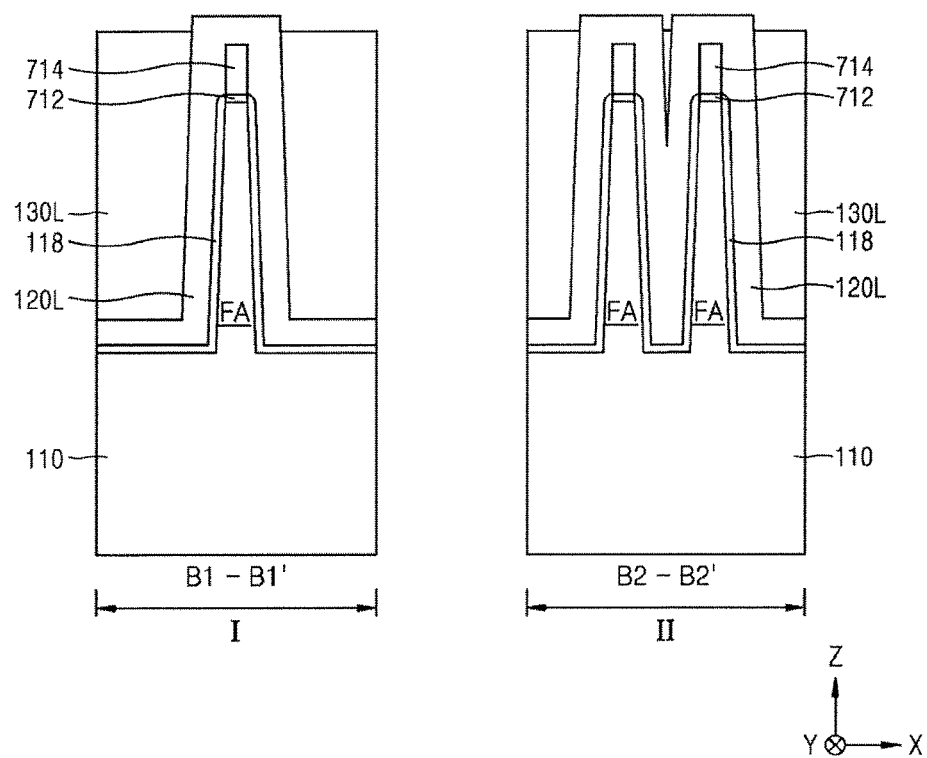

Referring to FIG. 7F, the isolation film 130L is partially removed from the top to expose the top surface of the burying insulating film 120L.

When the top surface of the burying insulating film 120L is exposed, a level of the top surface of the burying insulating film 120L may be higher than a level of the top surface of the isolation film 130L. In another implementation, when the top surface of the burying insulating film 120L is exposed, the top surface of the burying insulating film 120L may be positioned at the same level as the top surface of the isolation film 130L.

Figure 7G:
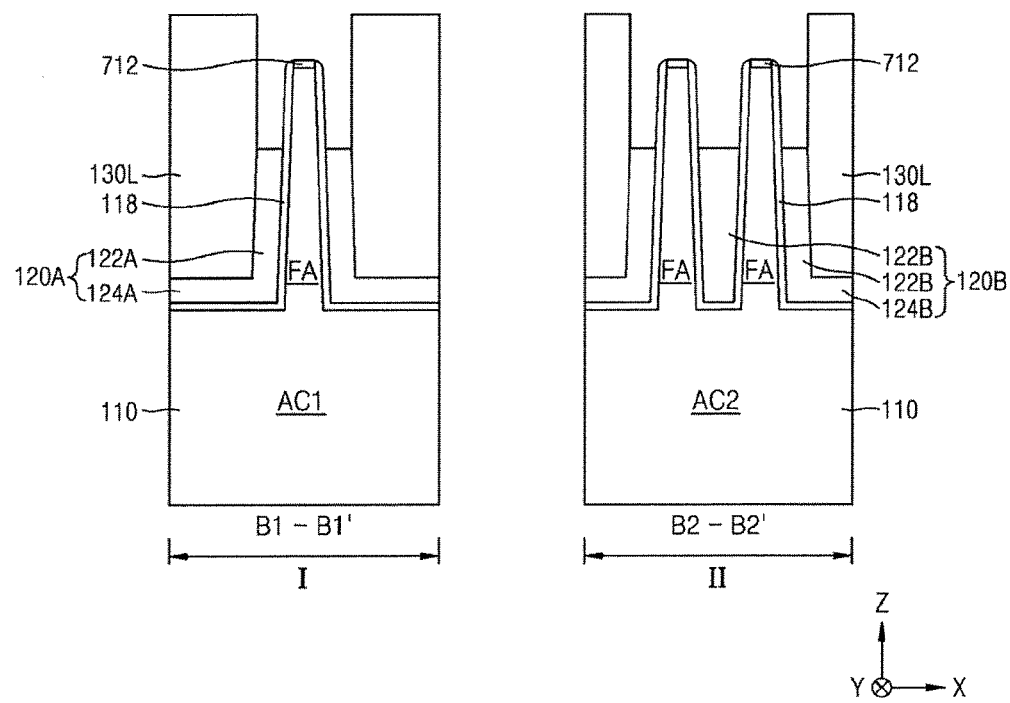

Referring to FIG. 7G. a deep trench for device isolation may be formed in the substrate 110 by partially etching the resultant structure shown in FIG. 7F in the first and second areas I and II, and then the deep trench is filled with an insulating film to form the isolation region DI shown in FIG. 1A. The first active region AC1 and the second active region AC2 may be defined by the isolation region DI on the substrate 110. To define the first active region AC1 and the second active region AC2, a plurality of deep trenches may be formed in the substrate 110 and filled with an insulating film.

Thereafter, the burying insulating film 120L is selectively removed from the exposed top surface of the burying insulating film 120L to a certain thickness, so that the remaining portions of the burying insulating film 120L become the base burying insulating films 120A and 120B.

To form the base burying insulating films 120A and 120B, the burying insulating film 120L (see FIG. 7F) may be selectively removed using wet etch. When the burying insulating film 120L is formed of a silicon nitride film, an etchant containing phosphoric acid as a main component may be used to selectively remove part of the burying insulating film 120L. For example, the etchant may contain phosphoric acid, an ammonium compound, and deionized water. The phosphoric acid content of the etchant may be adjusted according to the removal amount of the burying insulating film 120L. When the mask patterns 714 are formed of a similar material to or the same material as the burying insulating film 120L, the mask patterns 714 may also be removed while the part of the burying insulating film 120L is being selectively removed, so that the pad oxide film patterns 712 may be exposed. In addition, while the part of the burying insulating film 120L is being selectively removed, part of the isolation film 130L may be exposed to the etchant, and therefore, a bit of the isolation film 130L may be depleted. Thus, the width and thickness of portions of the isolation film 130L exposed to the etchant may be reduced.

When the base burying insulating films 120A and 120B are formed, a pad oxide film pattern 712 and the insulating liner 118 covering the upper sidewall of each fin-type active region FA may be exposed.

In the first area I, the base burying insulating film 120A may include a pair of vertical extensions 122A covering opposite side walls of the fin-type active region FA and a pair of horizontal extensions 124A extending in the horizontal direction from X-direction opposite edges of the first active region AC1 to cover the top surface of the first active region AC1.

In the second area II, the base burying insulating film 120B may include a pair of vertical extensions 122B filling a space between the fin-type active regions FA and covering opposite side walls of the base section BA of each fin-type active region FA and a pair of horizontal extensions 124B extending in the horizontal direction from X-direction opposite edges of the second active region AC2 to cover the top surface of the second active region AC2.

Figure 7H:
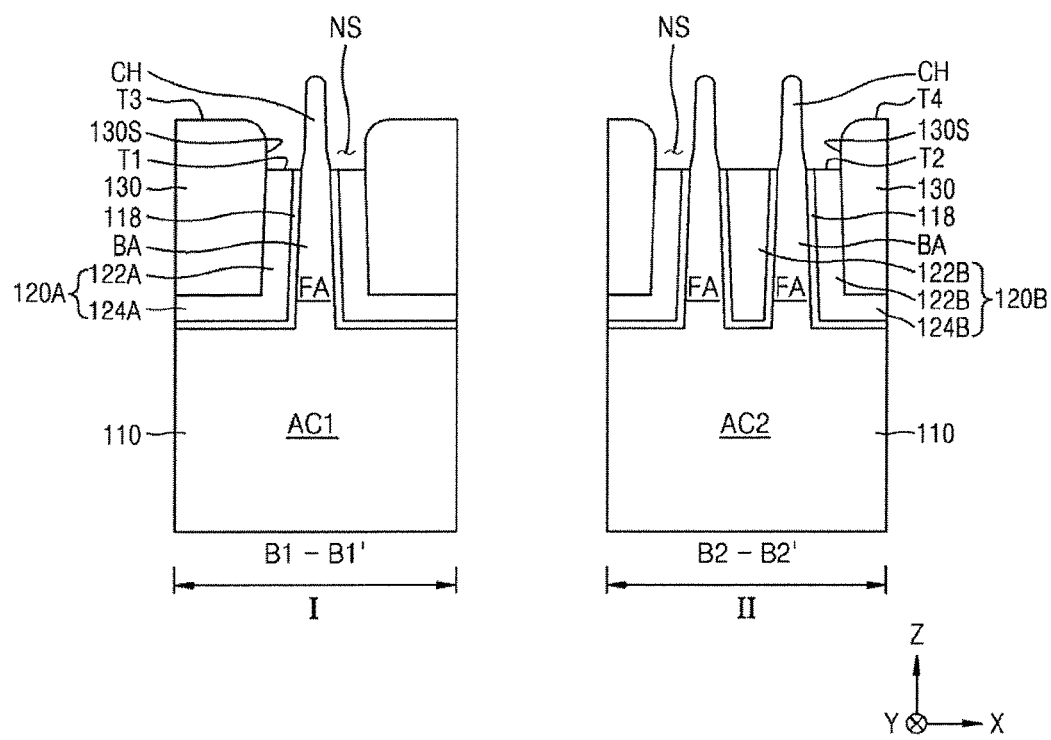

Referring to FIG. 7H, a recess process is performed on the first and second areas I and II to remove the isolation film 130L to a certain thickness from the top, thereby forming the isolation pattern 130 having the top surfaces T3 and T4 lower than the top surface of the fin-type active regions FA and higher than the top surfaces T1 and T2 of the respective vertical extensions 122A and 122B of the respective base burying insulating films 120A and 120B.

While the recess process is being performed to form the isolation pattern 130, a plurality of the pad oxide film patterns 712 and the insulating liner 118 covering the upper portion of the fin-type active regions FA are removed together, so that the channel section CH of each fin-type active region FA is exposed.

In some embodiments, the recess process may be performed using dry etch, wet etch, or a combination thereof. During the recess process, the channel section CH of each of the fin-type active regions FA in the first and second areas I and II is exposed to an etching atmosphere and/or a subsequent cleaning atmosphere, and therefore, part of the channel section CH may be depleted from the outer surface thereof by etching, oxidation, and/or cleaning. Thus, the width of the upper portion of the fin-type active regions FA may be reduced.

In addition, during the recess process, the top surface of each of the vertical extensions 122A and 122B of the base burying insulating films 120A and 120B may be exposed to the etching atmosphere and/or the subsequent cleaning atmosphere, so that the height of the vertical extensions 122A and 122B may be a little lowered. After the isolation pattern 130 is formed, the level of the top surfaces T1 and T2 of the vertical extensions 122A and 122B may substantially the same as the level of the border between the base section BA and the channel section CH of each fin-type active region FA.

After the isolation pattern 130 is formed, a narrow space NS between each channel section CH and the upper side wall 130S of the isolation pattern 130 may be defined.

In some embodiments, impurity ion implantation for threshold voltage control may be performed on the upper portion of each of the fin-type active regions FA exposed on the first and second areas I and II. To perform the impurity ion implantation for threshold voltage control, boron (B) ions may be implanted as impurities in a region where an NMOS transistor is formed in the first and second areas I and II, and phosphorus (P) or arsenic (As) ions may be implanted as impurities in a region where a PMOS transistor is formed in the first and second areas I and II.

Figure 7I:
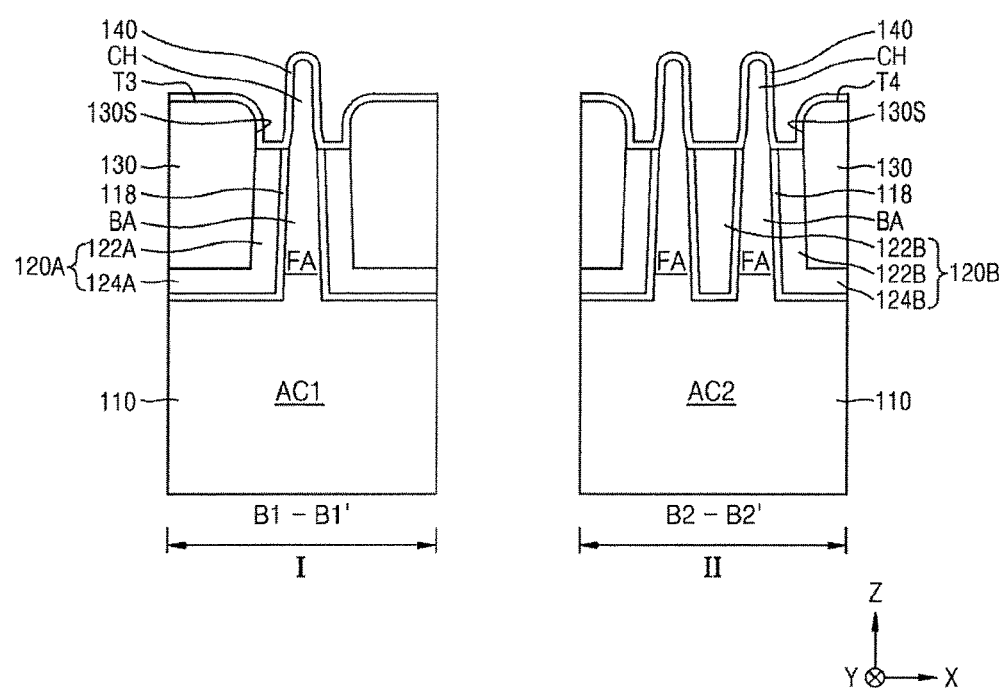

Referring to FIG. 7I, the gate insulating film 140 is formed to cover the channel section CH of each fin-type active region FA exposed in the first and second areas I and II.

Figure 7J:
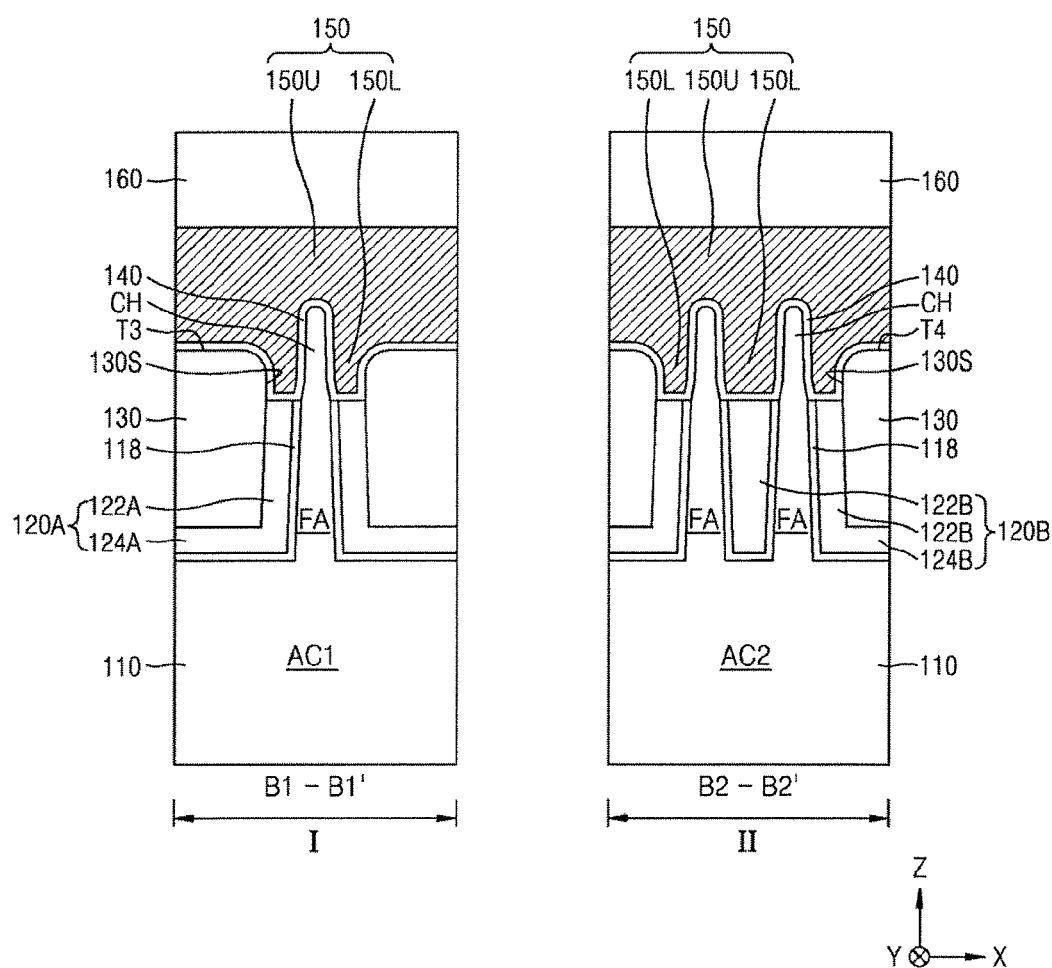

Referring to FIG. 7J, the gate line 150 and the insulating capping layer 160 are sequentially formed on the gate insulating film 140.

The gate line 150 may include the upper gate 150U, which extends long in a line shape in the X-direction to cover the upper side walls and top of the channel section CH of each fin-type active region FA, and a plurality of the lower gates 150L, which protrude from the upper gate 150U toward the substrate 110 and cover the lower side walls of the channel section CH of each fin-type active region FA. The upper gate 150U and the plurality of the lower gates 150L are integrally combined with one another. The lower gates 150L may be formed to fill narrow spaces NS between the upper side walls 130S of the isolation pattern 130 and each channel section CH and thus face the lower side walls of the channel section CH with the gate insulating film 140 therebetween.

In the first area I, each of the lower opposite side walls of the channel section of each fin-type active region FA may be covered with one of the lower gates 150L. In the second area II, a lower gate 150L disposed between two adjacent fin-type active regions FA among a plurality of the lower gates 150L may fully cover the channel section CH of each of the two adjacent fin-type active regions FA. In the second area II, an outermost lower gate 150L among the plurality of the lower gates 150L may cover only the channel section CH of a fin-type active region FA at the X-direction outermost side of the second active region AC2 among the plurality of the fin-type active regions FA.

According to the method of fabricating the integrated circuit device 100 described above with reference to FIGS. 7A through 7J, the thickness of portions of the gate line 150 covering the top surfaces T3 and T4 of the isolation pattern 130 may be less than the thickness of other portions adjacent to each fin-type active region FA, and therefore, a structure reducing parasitic capacitance between the gate line 150 and other adjacent conductors may be easily realized without additional photolithography.

Although the example of a method of fabricating the integrated circuit device 100 illustrated in FIGS. 1A and 1B has been described with reference to FIGS. 7A through 7J, integrated circuit devices having various structures described in the embodiments may be fabricated using various methods modified and variously changed.

For example, to fabricate the integrated circuit device 200 illustrated in FIG. 2, the gate line 250 including the first work function metal layer 250A, the second work function metal layer 250B, and the gap-fill metal layer 250C, which are sequentially stacked on the gate insulating film 140, may be formed instead of the gate line 150 in the stage of forming the gate line 150 described with reference to FIG. 7J. At this time, the thickness of the first work function metal layer 250A may be controlled such that a region of the gate line 250 including a lower gate 250L facing the lower portion of the channel section CH of each fin-type active region FA may have a higher threshold voltage than a region of the gate line 250 including the other portion facing the upper portion of the channel section CH, as shown in FIG. 2.

To fabricate the integrated circuit device 300 illustrated in FIG. 3, the gate line 350 including the first work function metal layer 350A, the second work function metal layer 350B, and the gap-fill metal layer 350C, which are sequentially stacked on the gate insulating film 140, may be formed instead of the gate line 150 in the stage of forming the gate line 150 described with reference to FIG. 7J. At this time, the thickness of the first work function metal layer 350A may be controlled such that the thickness G1 of the portion covering the top surface and side wall of each fin-type active region FA at the upper portion of the channel section CH in Z direction is greater than the thickness G2 of the portion covering the lower side wall of the channel section CH in X direction, as shown in FIG. 3, so that a region of the gate line 350 including a lower gate 350L facing the lower portion of the channel section CH between the upper side wall 130S of the isolation pattern 130 and the channel section CH may have a higher threshold voltage than a region of the gate line 350 including the other portion facing the upper portion of the channel section CH.

To fabricate the integrated circuit device 400 illustrated in FIGS. 4A through 4C, the isolation film 130L may be formed using the method described with reference to FIGS. 7A through 7E, and then the deep trench DT may be formed in the device isolation area DTA in the substrate 110 and the deep trench DT may be filled with the device isolation insulating film 134. Thereafter, processes similar to those described with reference to FIGS. 7F through 7J may be performed.

To fabricate the integrated circuit device 500 illustrated in FIG. 5, the gate line 250 may be formed using a method similar to the method of fabricating the integrated circuit device 200 illustrated in FIG. 2. To fabricate the integrated circuit device 600 illustrated in FIG. 6, the gate line 350 may be formed using a method similar to the method of fabricating the integrated circuit device 300 illustrated in FIG. 3.

Integrated circuit devices including a FinFET having a 3D channel and methods of fabricating the integrated circuit devices have been described with reference to FIGS. 7A through 7J. In other embodiments, integrated circuit devices including a planar MOSFET having characteristics described above and methods of fabricating the same may be provided by modifying and changing the above-described embodiments.

As described above, embodiments relate to an integrated circuit device including a fin-type active region.

Embodiments may provide an integrated circuit device including a transistor for increasing an operating speed and reducing power dissipation by reducing parasitic capacitance and securing an effective channel width enough to secure desired driving current even when the size of the integrated circuit device is reduced due to the high degree of integration.

According to an example embodiment, an integrated circuit device includes a base burying insulating film covering a lower side wall of a fin-type active region and an isolation pattern having a top surface higher than a top surface of the base burying insulating film to form a step difference at the bottom of a gate line, so that a portion of the gate line facing the top surface of the isolation pattern is thinner than other portions of the gate line. Accordingly, relative permittivity between the gate line and other adjacent conductors may be decreased and parasitic capacitance occurring due to coupling between adjacent conductive lines may also be decreased. Thus, degradation of the performance of a transistor may be prevented, the operating speed of the transistor may be increased, and power dissipation may be decreased. In addition, the composition and thickness of a work function metal layer forming a lower gate positioned at a narrow space between the lower portion of a channel section of the fin-type active region and the isolation pattern are controlled such that a target threshold voltage at the lower portion of the channel section may be higher than a target threshold voltage at the upper portion of the channel section. Thus, leakage current and a short channel effect occurring at the lower portion of the channel section of the fin-type active region are suppressed, so that the performance of the transistor may be increased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An integrated circuit device, comprising:
   a fin-type active region protruding from a substrate and extending longitudinally in a first horizontal direction;

a base burying insulating film including a vertical extension and a horizontal extension on the substrate, the vertical extension covering a lower side wall of the fin-type active region and having a first top surface at a first level, and the horizontal extension being integrally connected to the vertical extension and covering a top surface of the substrate;

an isolation pattern covering a side wall of the vertical extension on the horizontal extension and having a second top surface at a second level, the second level being higher than the first level; and a gate line having an upper gate and a lower gate, the upper gate extending in a second horizontal direction crossing the first horizontal direction to cover an upper portion of a channel section of the fin-type active region and the second top surface of the isolation pattern, and the lower gate protruding from the upper gate toward the substrate and filling a space on the first top surface between a lower portion of the channel section and an upper side wall of the isolation pattern.

2. The integrated circuit device as claimed in claim 1, wherein the vertical extension covers a side wall of a base section between the substrate and the channel section of the fin-type active region.

3. The integrated circuit device as claimed in claim 1, wherein the base burying insulating film and the isolation pattern include different materials.

4. The integrated circuit device as claimed in claim 1, wherein a dielectric constant of the base burying insulating film is lower than a dielectric constant of the isolation pattern.

5. The integrated circuit device as claimed in claim 1, wherein the gate line includes a work function metal layer covering the channel section, and the lower gate is formed of part of the work function metal layer.

6. The integrated circuit device as claimed in claim 5, wherein a first thickness of a first portion included in the lower gate in the work function metal layer is different from a second thickness of a second portion included in the upper gate in the work function metal layer.

7. The integrated circuit device as claimed in claim 1, wherein the gate line includes a work function metal layer covering the channel section, and a first thickness of a first portion of the work function metal layer covering the lower portion of the channel section is different from a second thickness of a second portion of the work function metal layer covering the upper portion of the channel section.

8. The integrated circuit device as claimed in claim 7, wherein the first thickness is greater than the second thickness.

9. The integrated circuit device as claimed in claim 7, wherein the first thickness is less than the second thickness.

10. The integrated circuit device as claimed in claim 1, wherein a thickness of a portion of the gate line covering the second top surface of the isolation pattern is less than a thickness of a portion of the gate line covering the vertical extension.

11. An integrated circuit device, comprising:
a substrate having an active region;
a plurality of fin-type active regions protruding from the active region and extending in a first horizontal direction in parallel with each other;
a base burying insulating film including a plurality of vertical extensions and a horizontal extension, the plurality of vertical extensions each filling a space between adjacent fin-type active regions among the plurality of fin-type active regions or covering a side wall of each of the plurality of fin-type active regions, and the horizontal extension being integrally connected to an outermost vertical extension among the plurality of vertical extensions and covering a top surface of the active region;

an isolation pattern separated from the fin-type active regions with the outermost vertical extension therebetween and having an upper side wall facing a channel section of an outermost fin-type active region among the plurality of fin-type active regions; and a gate line extending in a second horizontal direction crossing the first horizontal direction to cover channel sections of the respective fin-type active regions, the base burying insulating film, and the isolation pattern, wherein the gate line includes an upper gate covering an upper portion of the channel section of the outermost fin-type active region and a first lower gate filling a space between the upper side wall of the isolation pattern and a lower portion of the channel section of the outermost fin-type active region and protruding from the upper gate toward the substrate.

12. The integrated circuit device as claimed in claim 11, wherein the gate line further includes a second lower gate protruding from the upper gate toward the substrate between two adjacent fin-type active regions among the plurality of fin-type active regions and covering a lower portion of a channel section of each of the two adjacent fin-type active regions.

13. The integrated circuit device as claimed in claim 12, wherein a width of the second lower gate is greater than a width of the first lower gate in the second horizontal direction.

14. The integrated circuit device as claimed in claim 12, wherein the plurality of vertical extensions include an inner vertical extension between the two adjacent fin-type active regions, and the second lower gate has a bottom surface facing the inner vertical extension.

15. The integrated circuit device as claimed in claim 11, wherein the plurality of vertical extensions include an inner vertical extension between two adjacent fin-type active regions among the plurality of fin-type active regions, and a width of the outermost vertical extension is less than a width of the inner vertical extension in the second horizontal direction.

16. The integrated circuit device as claimed in claim 11, wherein the gate line further includes a work function metal layer extending in the second horizontal direction to cover the channel sections of the respective fin-type active regions, and a thickness of a first portion forming the first lower gate in the work function metal layer is different from a thickness of a second portion forming the upper gate in the work function metal layer.

17. The integrated circuit device as claimed in claim 11, wherein a thickness of a portion of the gate line covering a top surface of the isolation pattern is less than a thickness of a portion of the gate line covering the outermost vertical extension.

18. An integrated circuit device, comprising:
a device area defined by a device isolation area on a substrate;
a plurality of fin-type active regions each having a base section connected to the device area and a channel section on the base section;
a base burying insulating film including a plurality of vertical extensions and a horizontal extension, the vertical extensions being between the plurality of fin-type active regions and covering opposite side walls of the base section of each of the plurality of fin-type active regions, and the horizontal extension being integrally connected to an outermost vertical extension closest to the device isolation area among the plurality of vertical extensions and covering the device area;

a device isolation insulating film formed in the device isolation area and having a top surface higher than a top surface of the outermost vertical extension; and an isolation pattern between the outermost vertical extension and the device isolation insulating film, the isolation pattern having a top surface higher than the top surface of the outermost vertical extension and an upper side wall defining a narrow space between the isolation pattern and a channel section of an outermost fin-type active region closest to the device isolation area among the plurality of fin-type active regions.

19. The integrated circuit device as claimed in claim 18, wherein the narrow space has a width less than a distance between any two adjacent fin-type active regions among the plurality of fin-type active regions.

20. The integrated circuit device as claimed in claim 18, wherein the outermost vertical extension has a width less than a width of an inner vertical extension among the plurality of the vertical extensions, the inner vertical extension being between any two adjacent fin-type active regions among the plurality of fin-type active regions.

* * * * *